(12) United States Patent
Mizumura et al.

(10) Patent No.: US 8,416,571 B2
(45) Date of Patent: Apr. 9, 2013

(54) STORAGE APPARATUS AND METHOD OF CONTROLLING COOLING FANS FOR STORAGE APPARATUS

(75) Inventors: Takakatsu Mizumura, Chigasaki (JP); Masato Ogawa, Chigasaki (JP); Tetsuya Inoue, Odawara (JP); Yosuke Nakayama, Odawara (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/811,136

(22) PCT Filed: Jun. 11, 2010

(86) PCT No.: PCT/JP2010/003898
§ 371 (c)(1),
(2), (4) Date: Jun. 29, 2010

(87) PCT Pub. No.: WO2011/155003
PCT Pub. Date: Dec. 15, 2011

(65) Prior Publication Data
US 2012/0140402 A1  Jun. 7, 2012

(51) Int. Cl.
*H05K 7/20* (2006.01)
(52) U.S. Cl.
USPC ..... 361/695; 361/679.48; 361/694; 62/259.2; 700/299; 700/304
(58) Field of Classification Search .................... None
See application file for complete search history.

(56) References Cited

U.S. PATENT DOCUMENTS

| 7,643,281 B2 * | 1/2010 | Okamoto et al. ........ 361/679.33 |
| 7,894,191 B2 * | 2/2011 | Tsuchiya ..................... 361/695 |
| 8,081,456 B2 * | 12/2011 | Iguchi .......................... 361/695 |
| 2002/0121555 A1 * | 9/2002 | Cipolla et al. ............... 236/49.1 |
| 2006/0101833 A1 | 5/2006 | Lucas et al. |
| 2007/0113107 A1 | 5/2007 | Ohara |

FOREIGN PATENT DOCUMENTS

| EP | 1 486 863 A1 | 12/2004 |
| EP | 2 128 738 A2 | 12/2009 |
| JP | 2007-142047 A | 6/2007 |

* cited by examiner

*Primary Examiner* — Courtney Smith
(74) *Attorney, Agent, or Firm* — Mattingly & Malur, PC

(57) ABSTRACT

A storage apparatus includes: a storage drive providing a physical storage area for creating a logical storage area used by an external apparatus; a storage controller including a plurality of central processing units (CPUs) executing data write processing from the external apparatus to the storage drive, and data read processing from the storage drive; a plurality of cooling fans cooling the storage drive; a temperature sensor detecting a temperature of air introduced or discharged by the cooling fans; and a revolving speed sensor detecting a revolving speed of each cooling fan. Any of the CPUs executes operation control processing in which, through a data network path to the storage drive for the data write and read processing, measurement values of the temperature and revolving speed sensors are acquired and a revolving speed setup value of the fans is calculated and is transmitted to the cooling fans.

12 Claims, 30 Drawing Sheets

EXAMPLE OF FAN OPERATION CONTROL SYSTEM IN PRESENT EMBODIMENT

[Fig. 1]
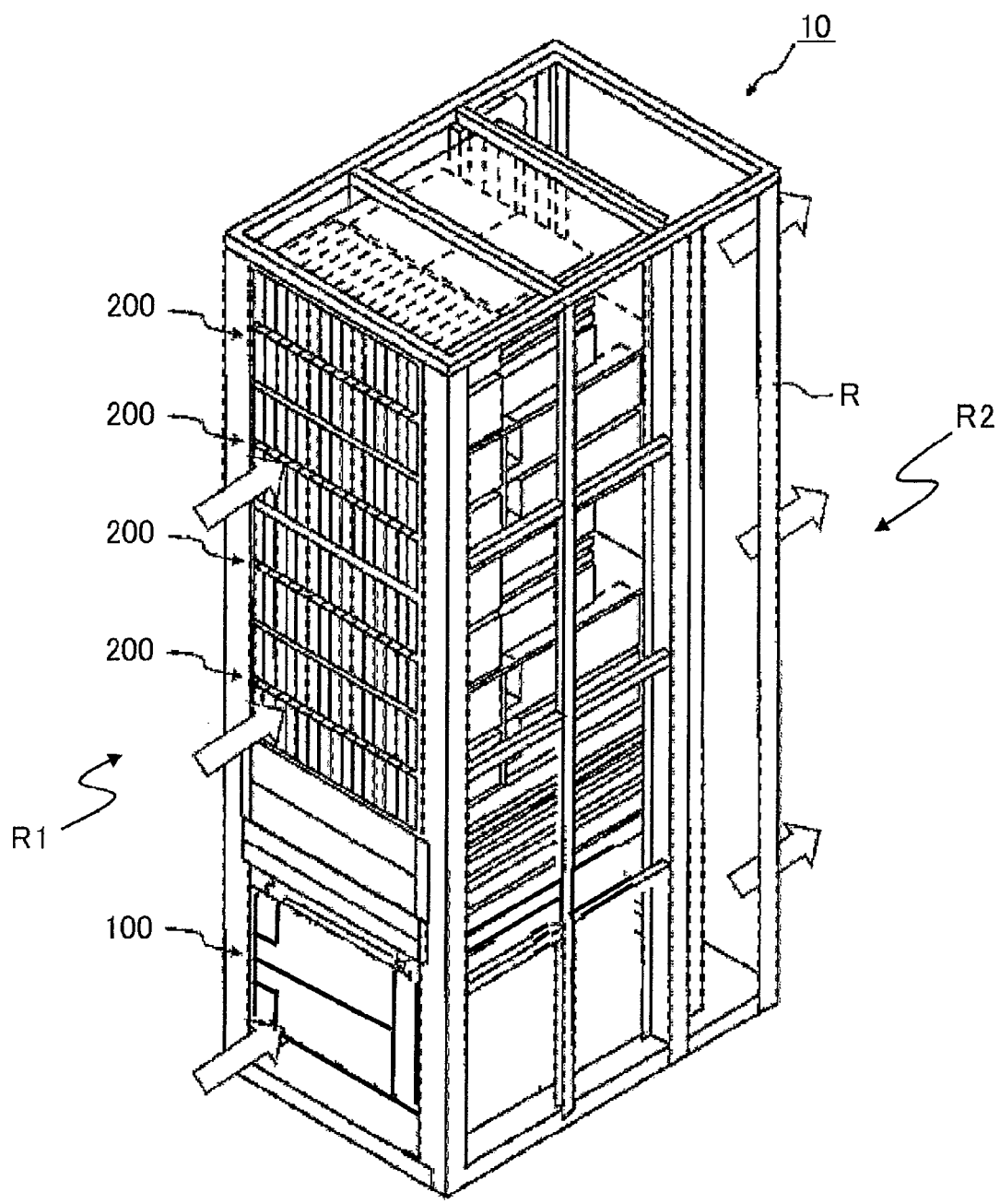

[Fig. 2]
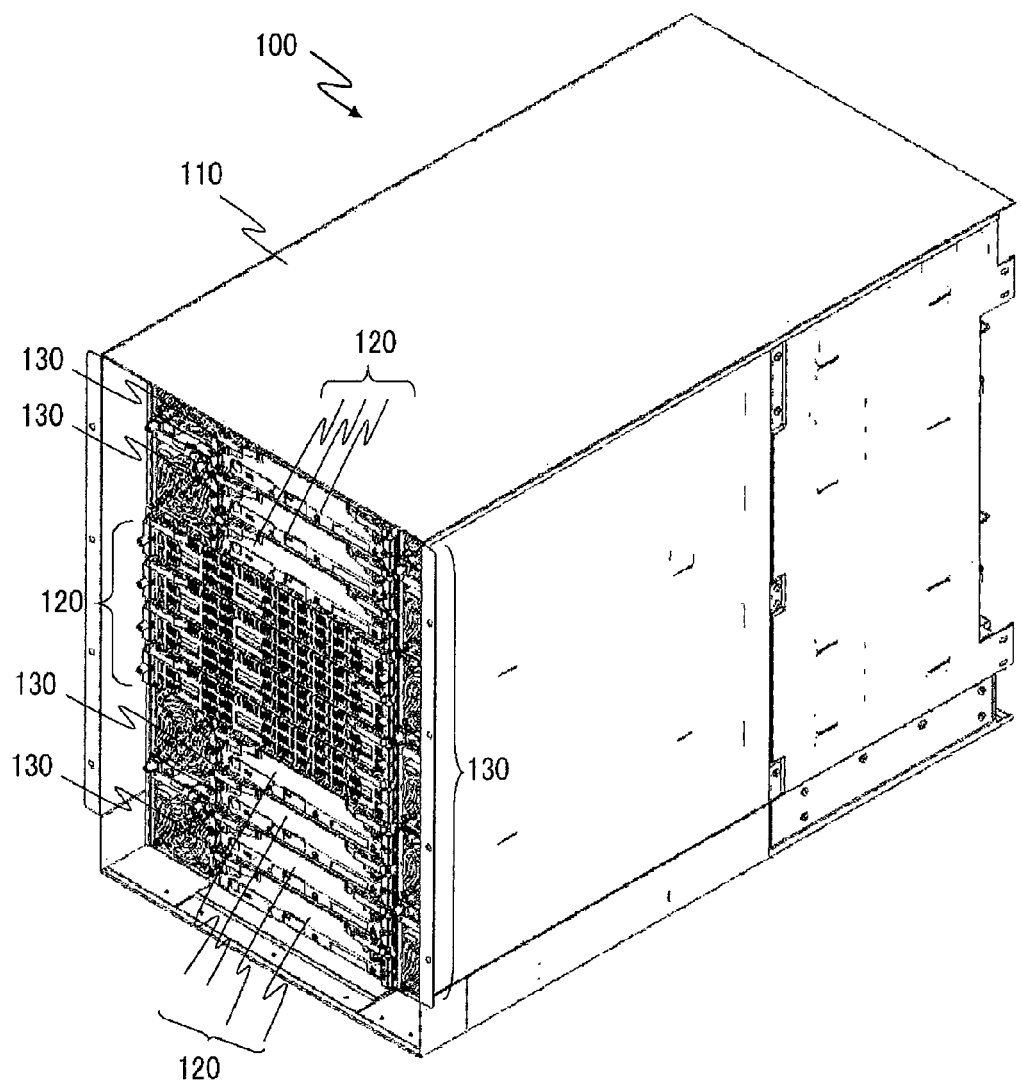

[Fig. 3]
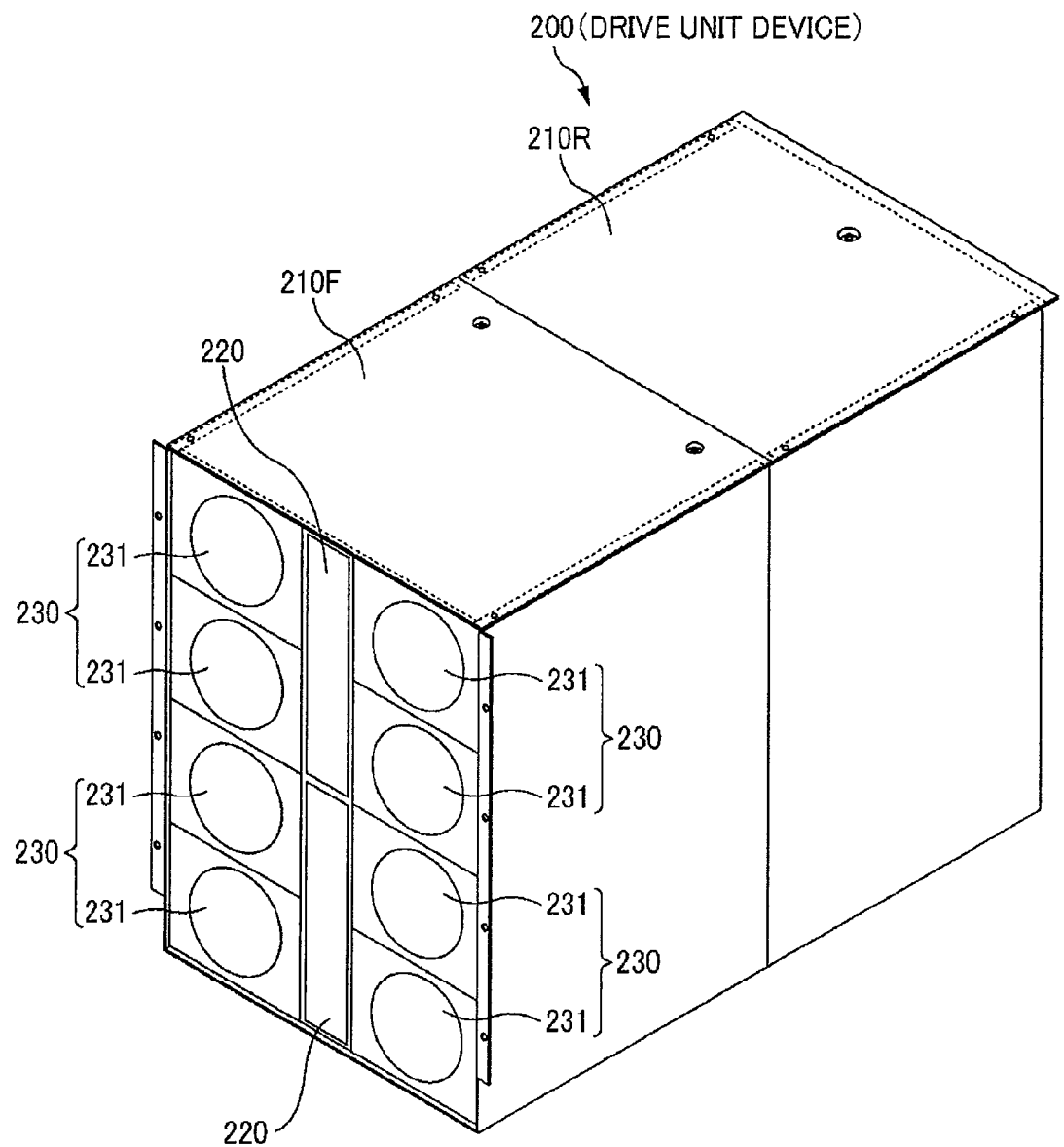

[Fig. 4A]
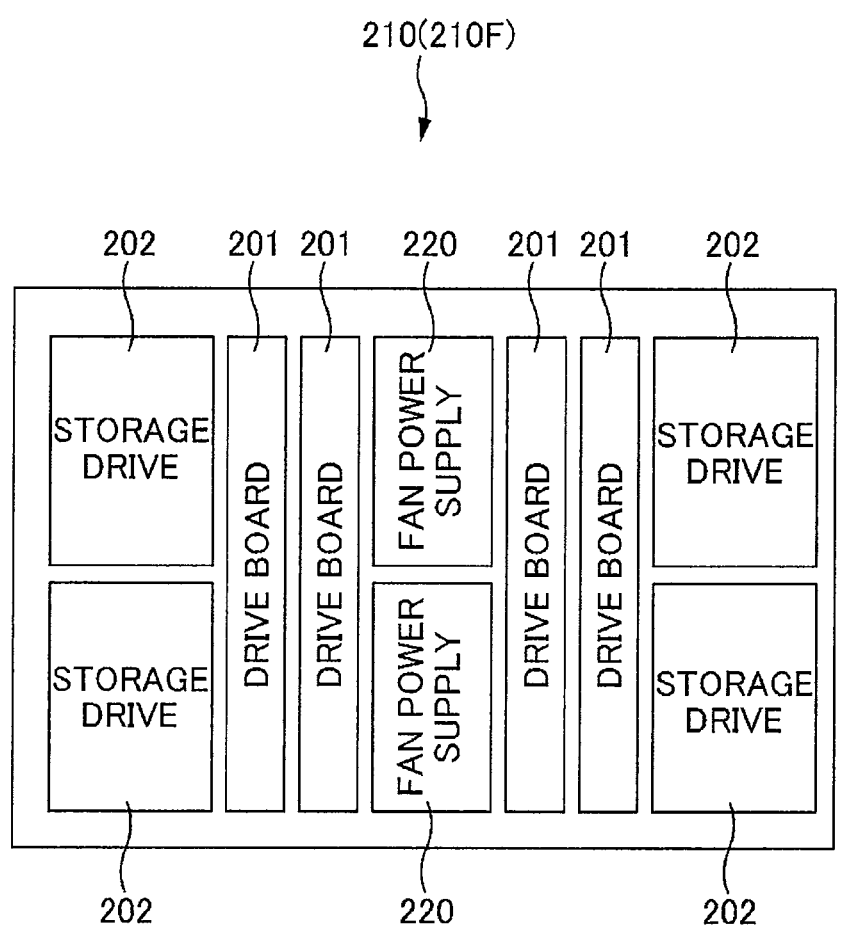

[Fig. 4B]
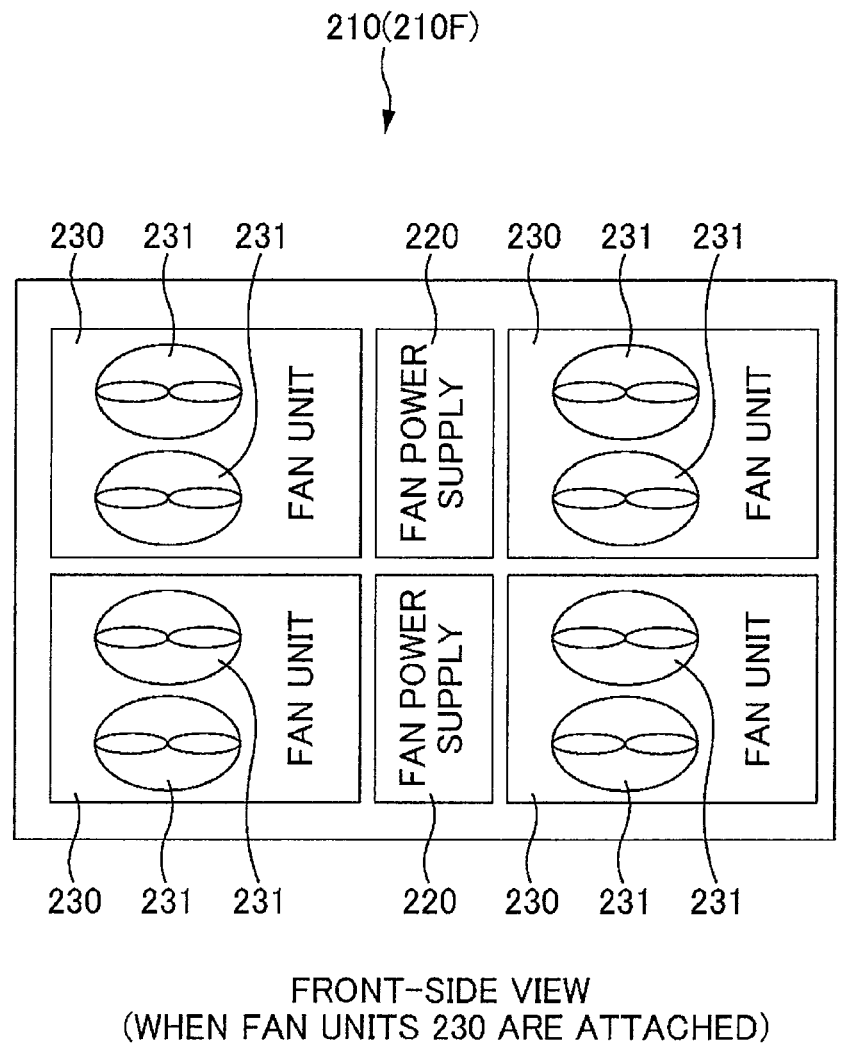
FRONT-SIDE VIEW
(WHEN FAN UNITS 230 ARE ATTACHED)

[Fig. 5A]
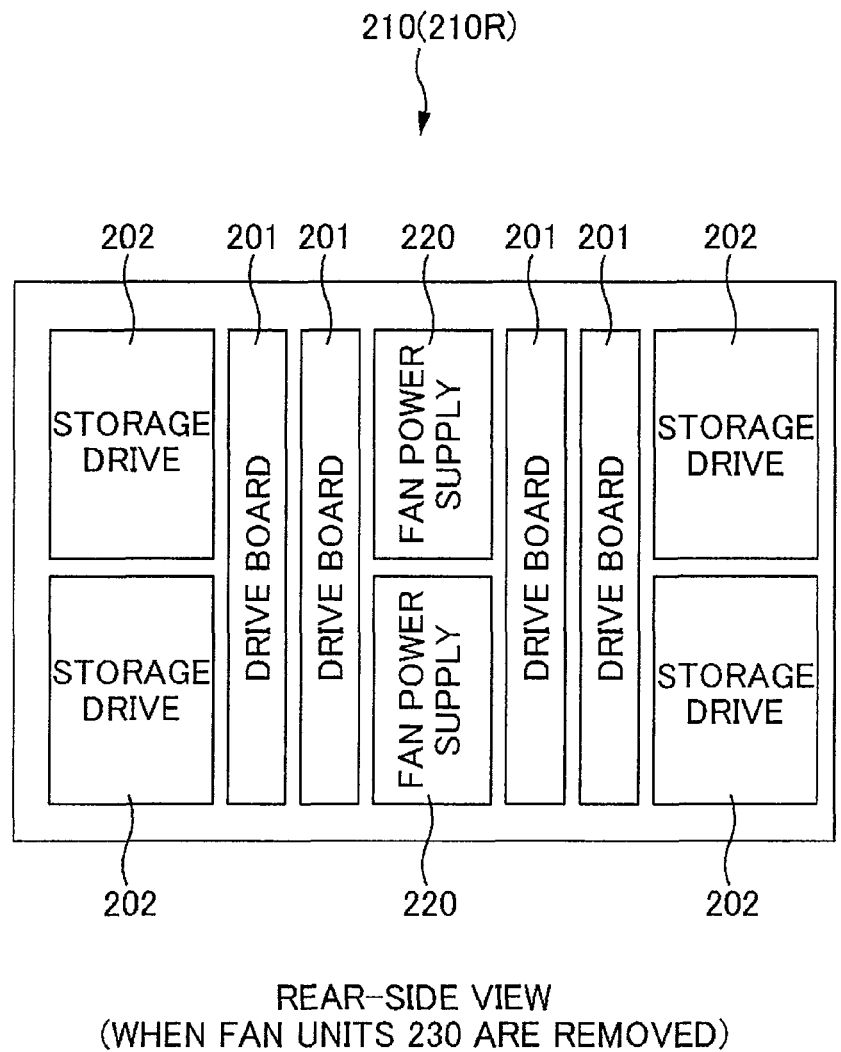
REAR-SIDE VIEW
(WHEN FAN UNITS 230 ARE REMOVED)

[Fig. 5B]
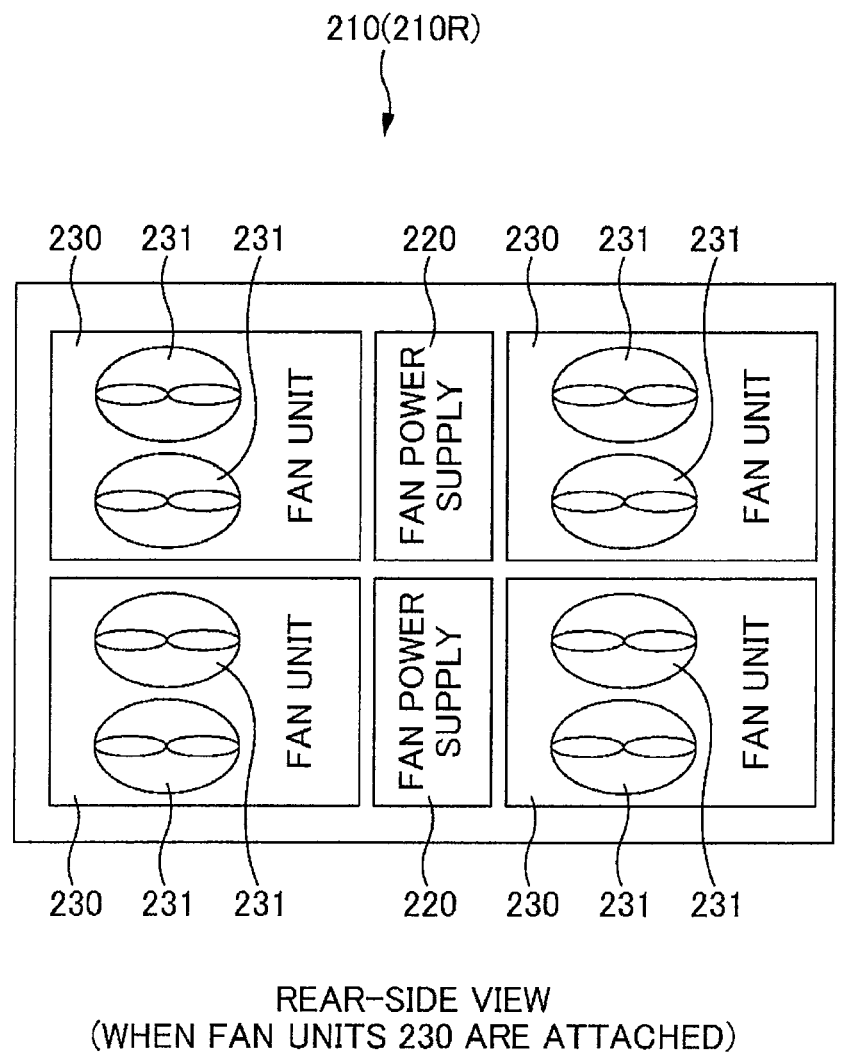
REAR-SIDE VIEW
(WHEN FAN UNITS 230 ARE ATTACHED)

[Fig. 6]
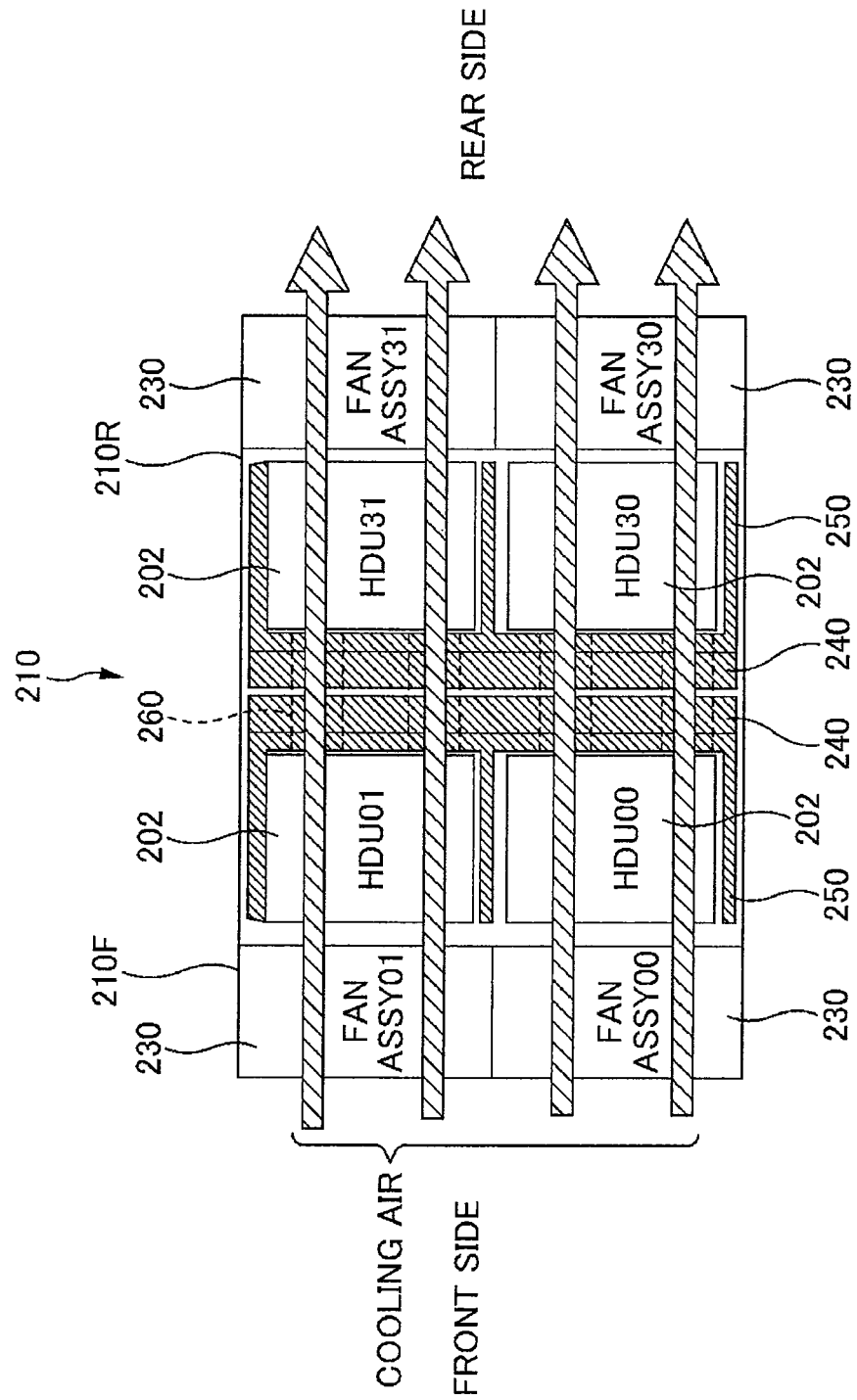

[Fig. 7]
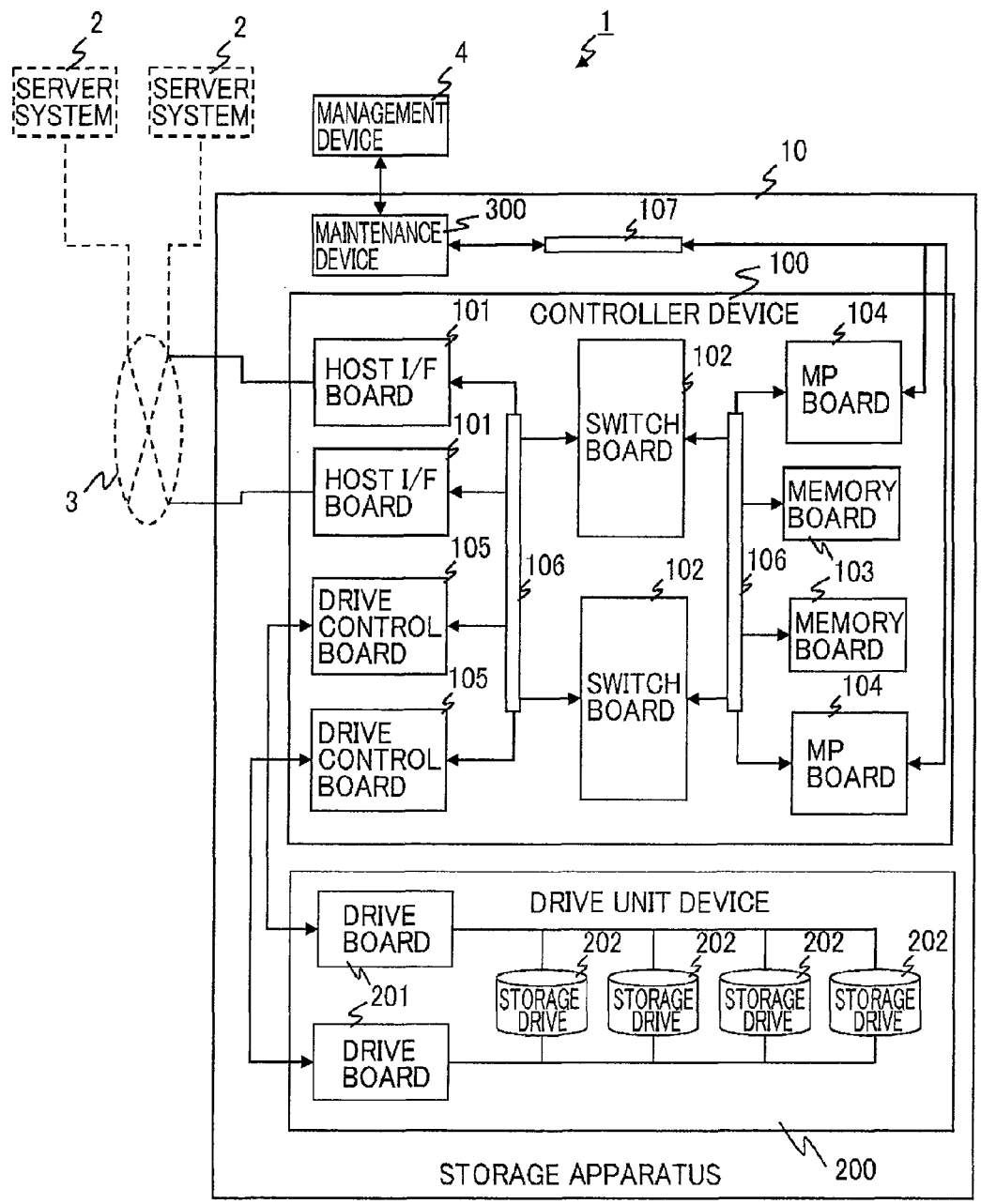

[Fig. 8]
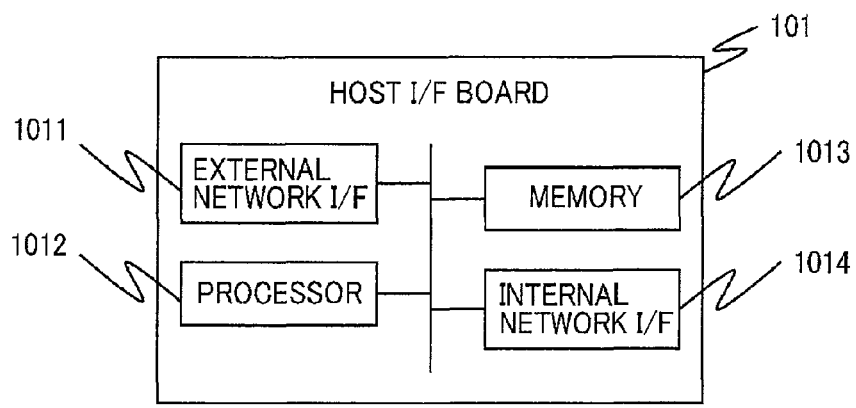
[Fig. 9]
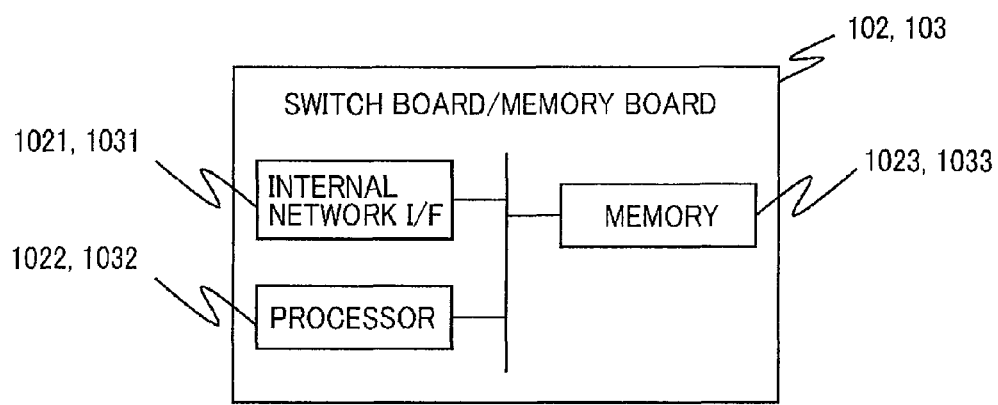

[Fig. 10]
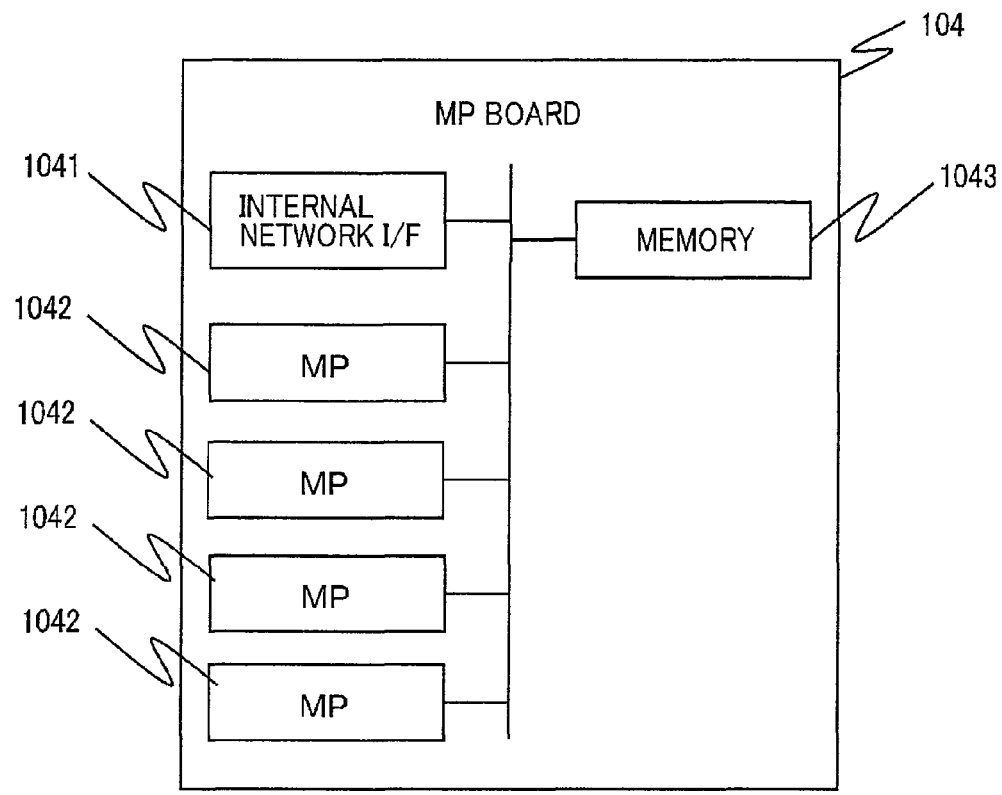
[Fig. 11]
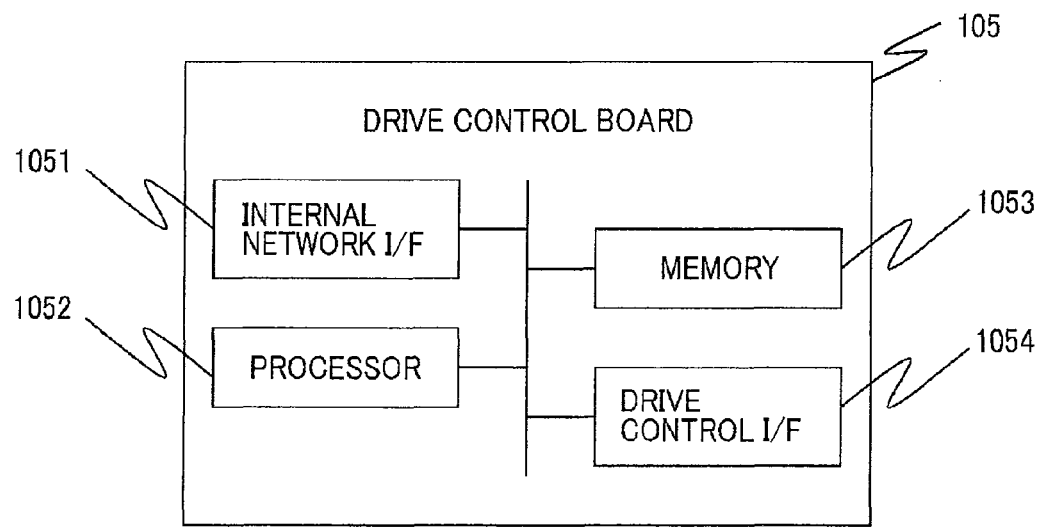

[Fig. 12]
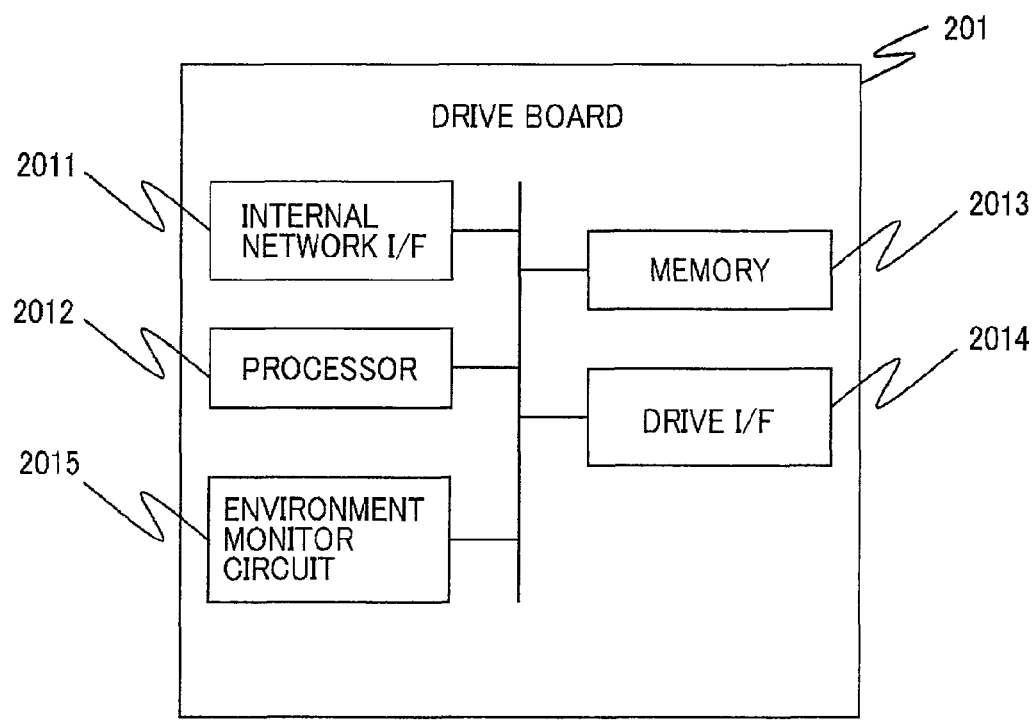

[Fig. 13]
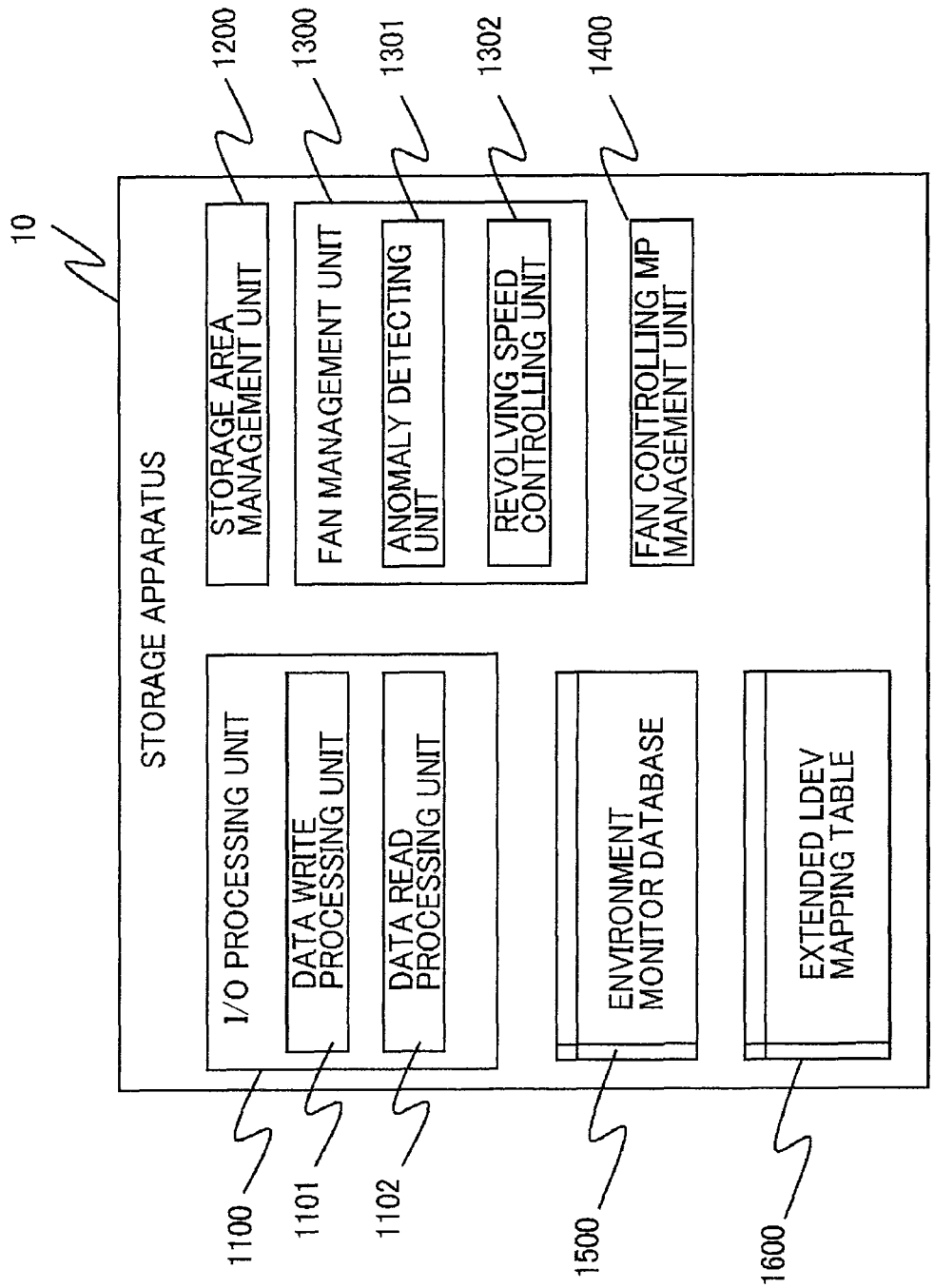

[Fig. 14]

ENVIRONMENT MONITOR DATABASE 1500

| NUMBER | REVOLVING SPEED (rpm) | | | |
|---|---|---|---|---|
| | F01 | F02 | ... | Fn |
| 1 | 7000 | 7500 | ... | 7000 |
| 2 | 7000 | 7000 | ... | 10000 |
| 3 | 10000 | 7000 | ... | 7500 |
| ... | ... | ... | ... | ... |
| NUMBER | TEMPERATURE MEASUREMENT VALUE (°C) | | | |
| | FU00 | FU01 | ... | FU31 |
| 1 | 20 | 30 | ... | 22 |
| 2 | 22 | 32 | ... | 23 |
| 3 | 19 | 35 | ... | 20 |
| ... | ... | ... | ... | ... |

[Fig. 15]

CONVENTIONAL STRUCTURE EXAMPLE OF LDEV MAPPING TABLE

| MP NUMBER / LDEV NUMBER | 0 | 1 | 2 | ... | m |
|---|---|---|---|---|---|
| 0 | 1 | 1 | 0 | | |
| 1 | 0 | 1 | 0 | | |
| 2 | 0 | 0 | 1 | | |
| ... | | | | | |
| n | | | | | |

[Fig. 16]

EXTENDED LDEV MAPPING TABLE 1600

| LDEV NUMBER | MP NUMBER | 00 | 01 | 02 | ... | 13 |
|---|---|---|---|---|---|---|
| 0 | OWNERSHIP | 1 | 1 | 0 | | |
|   | FAN CONTROL REPRESENTATIVE | 1 | 0 | 0 | | |
|   | FAN CONTROL SUB-REPRESENTATIVE | 0 | 1 | 0 | | |
| 1 | OWNERSHIP | 0 | 0 | 1 | | |
|   | FAN CONTROL REPRESENTATIVE | 0 | 0 | 1 | | |
|   | FAN CONTROL SUB-REPRESENTATIVE | 0 | 0 | 0 | | |
| 2 | OWNERSHIP | 0 | 1 | 1 | | |
|   | FAN CONTROL REPRESENTATIVE | 0 | 1 | 0 | | |
|   | FAN CONTROL SUB-REPRESENTATIVE | 0 | 0 | 1 | | |
| ... | | | | | | |
| n | OWNERSHIP | 1 | 0 | 1 | | |
|   | FAN CONTROL REPRESENTATIVE | 0 | 0 | 0 | | |
|   | FAN CONTROL SUB-REPRESENTATIVE | 1 | 0 | 0 | | |

[Fig. 17]
EXAMPLE OF CONVENTIONAL FAN OPERATION CONTROL SYSTEM
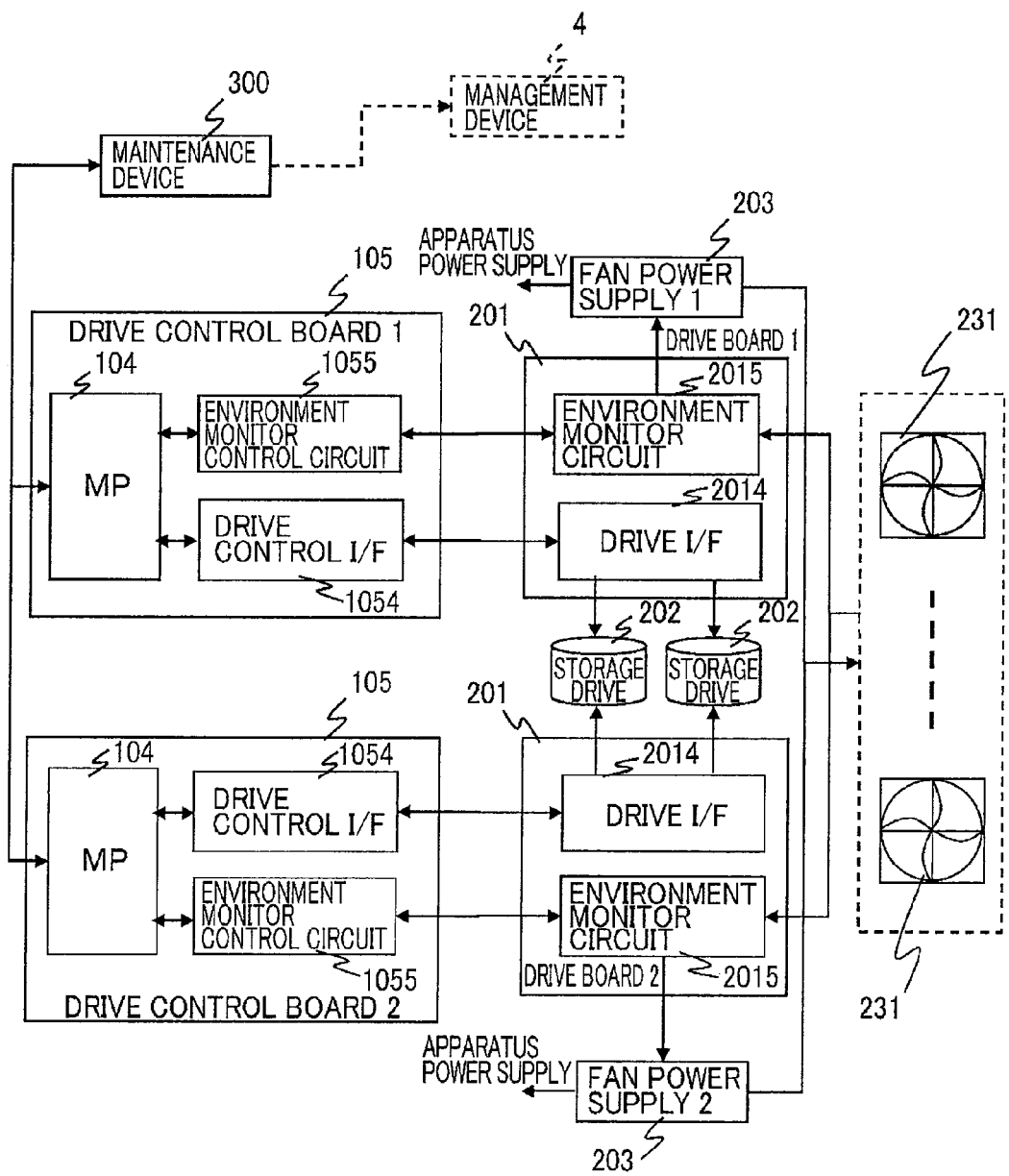

[Fig. 18]
EXAMPLE OF FAN OPERATION CONTROL SYSTEM IN PRESENT EMBODIMENT
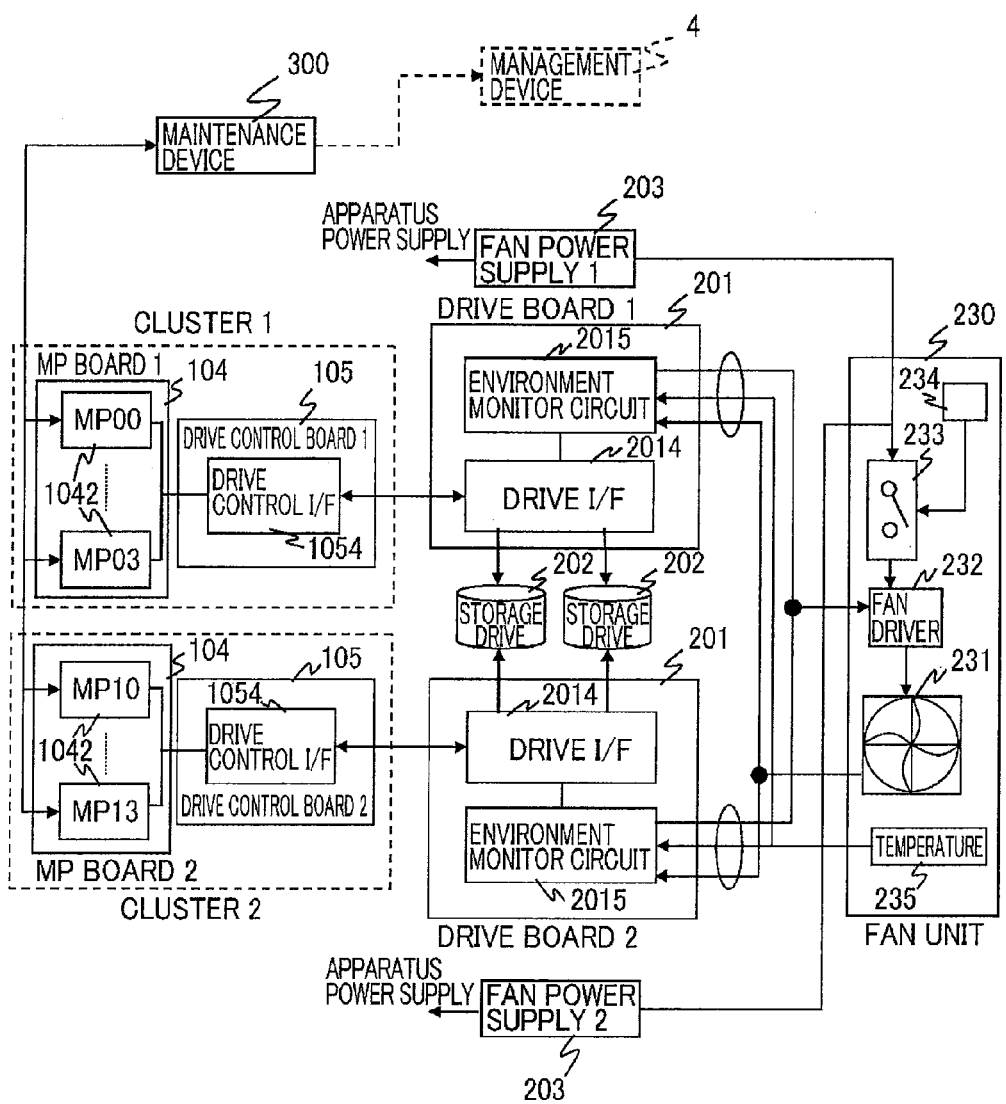

[Fig. 19]
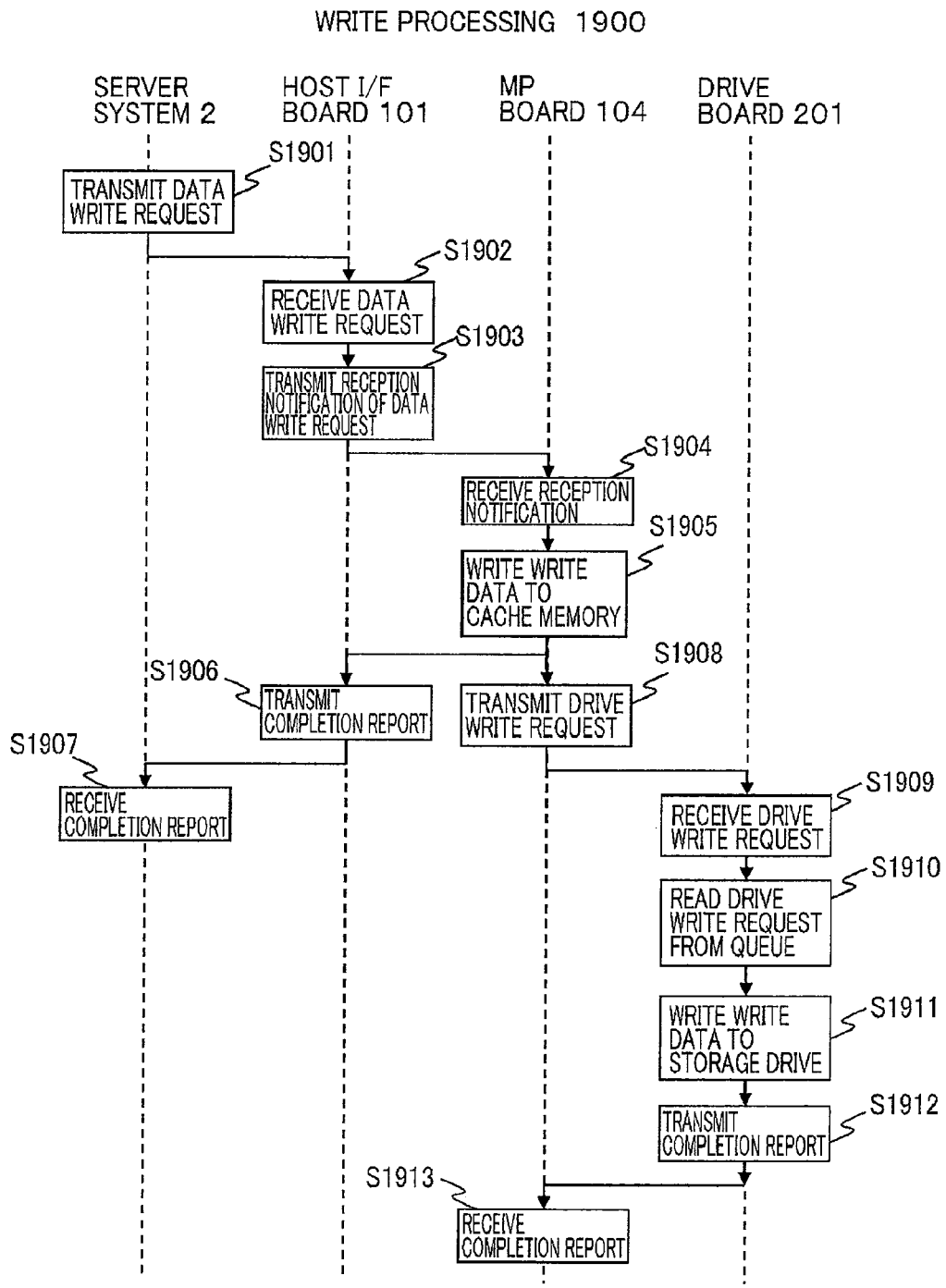

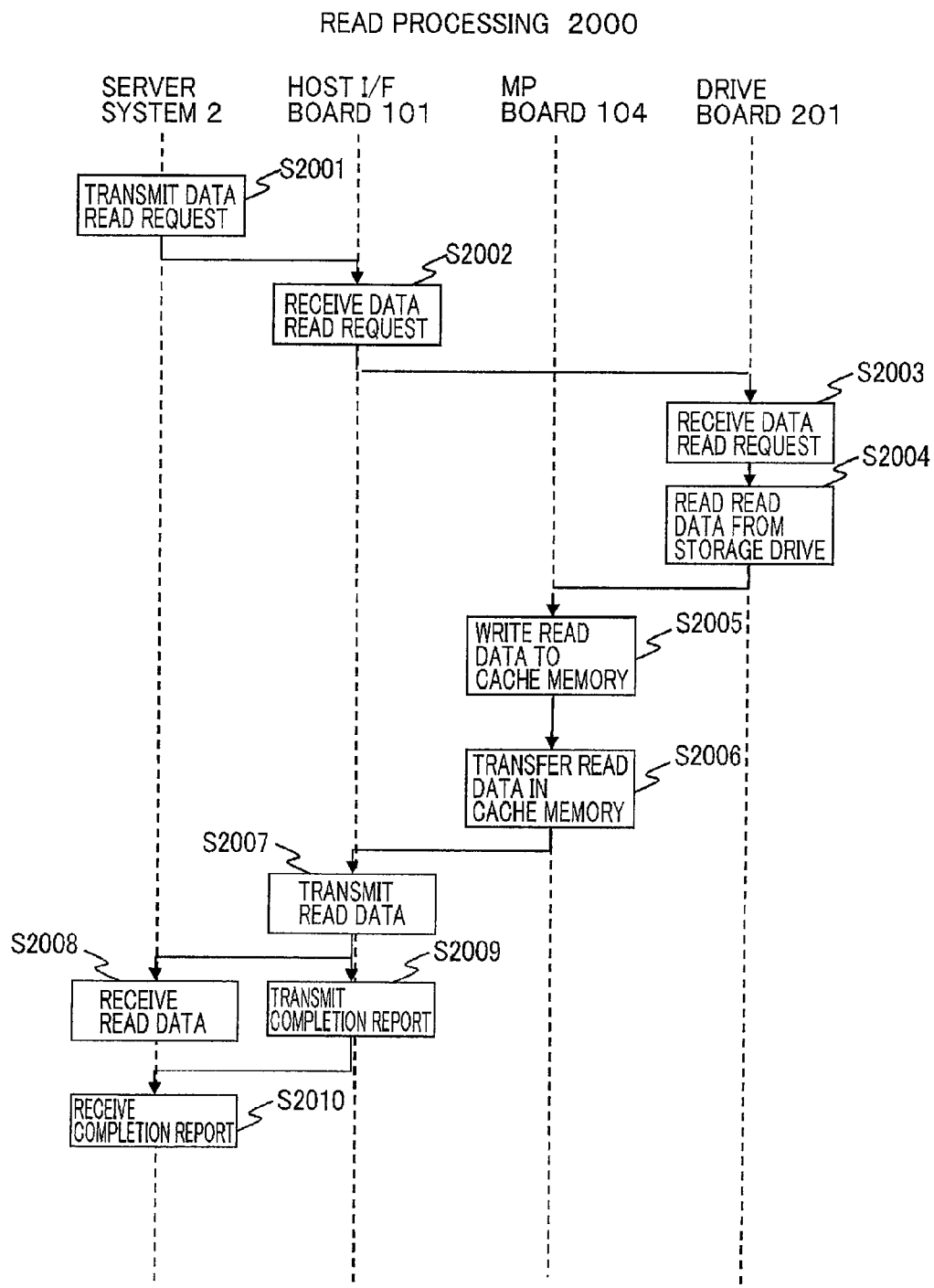

[Fig. 21]
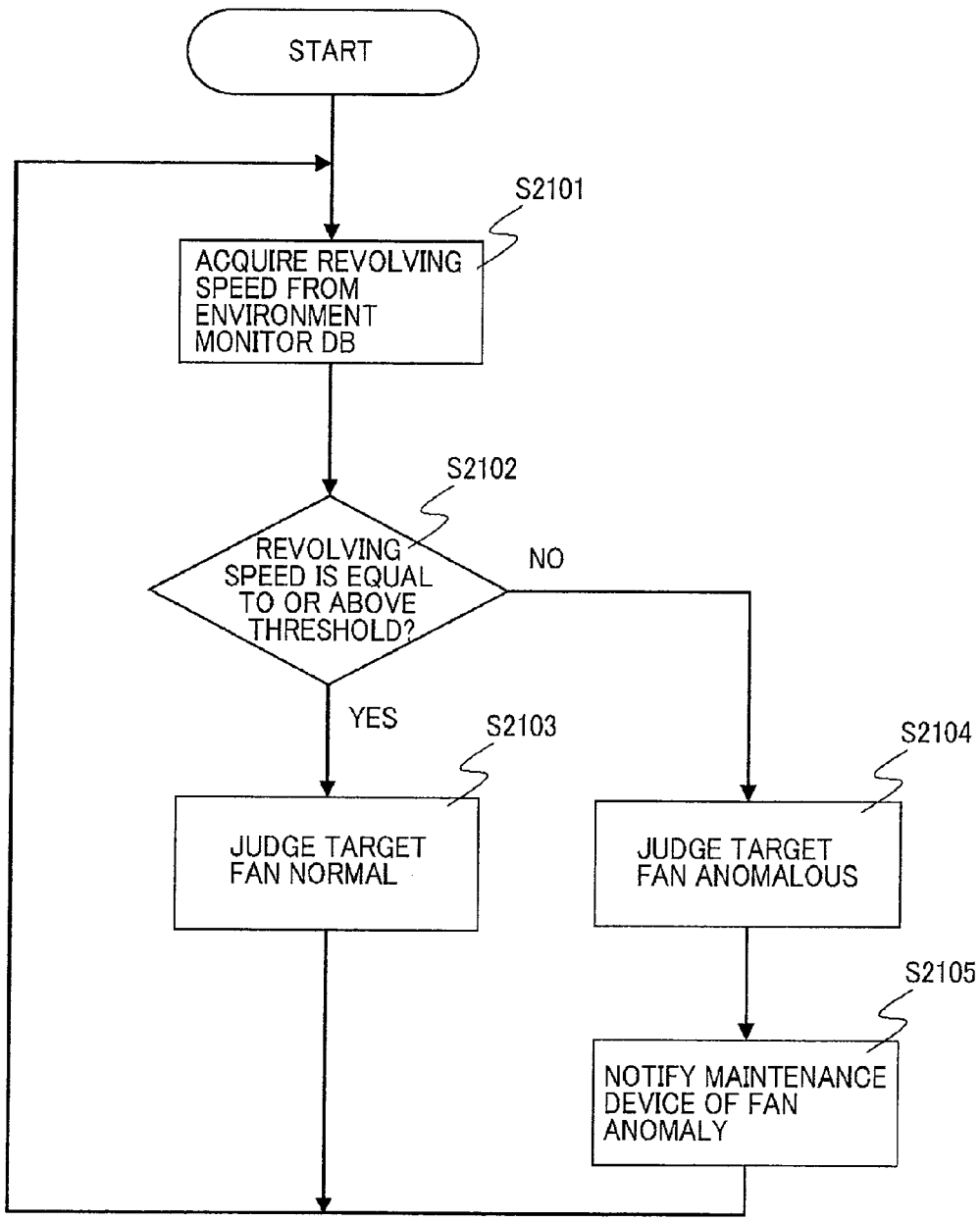

[Fig. 22]
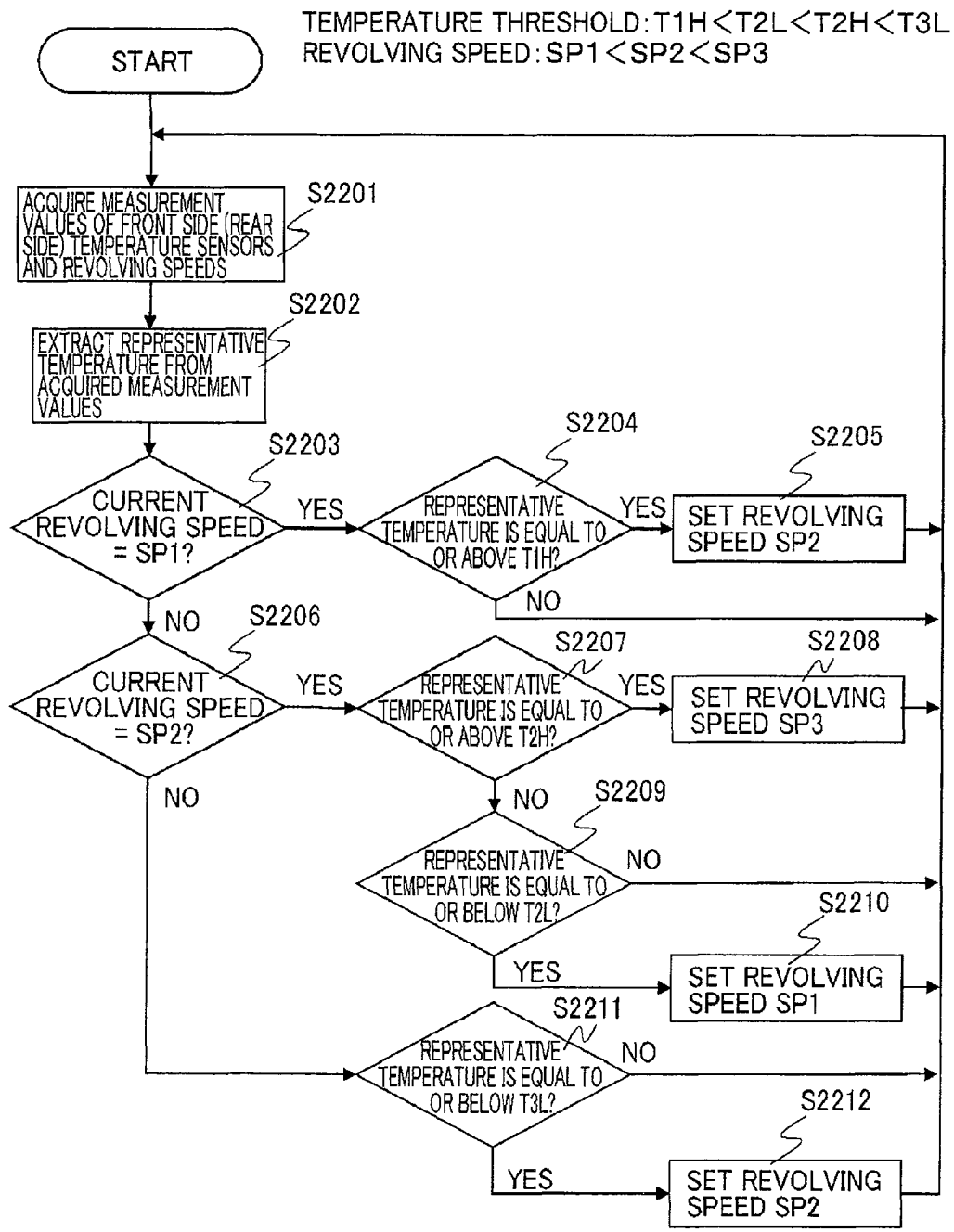

[Fig. 23]
FAN REVOLVING SPEED CONTROL PROCESSING
(PREDICTION OF INTAKE AIR (DISCHARGE AIR) TEMPERATURE) 2300
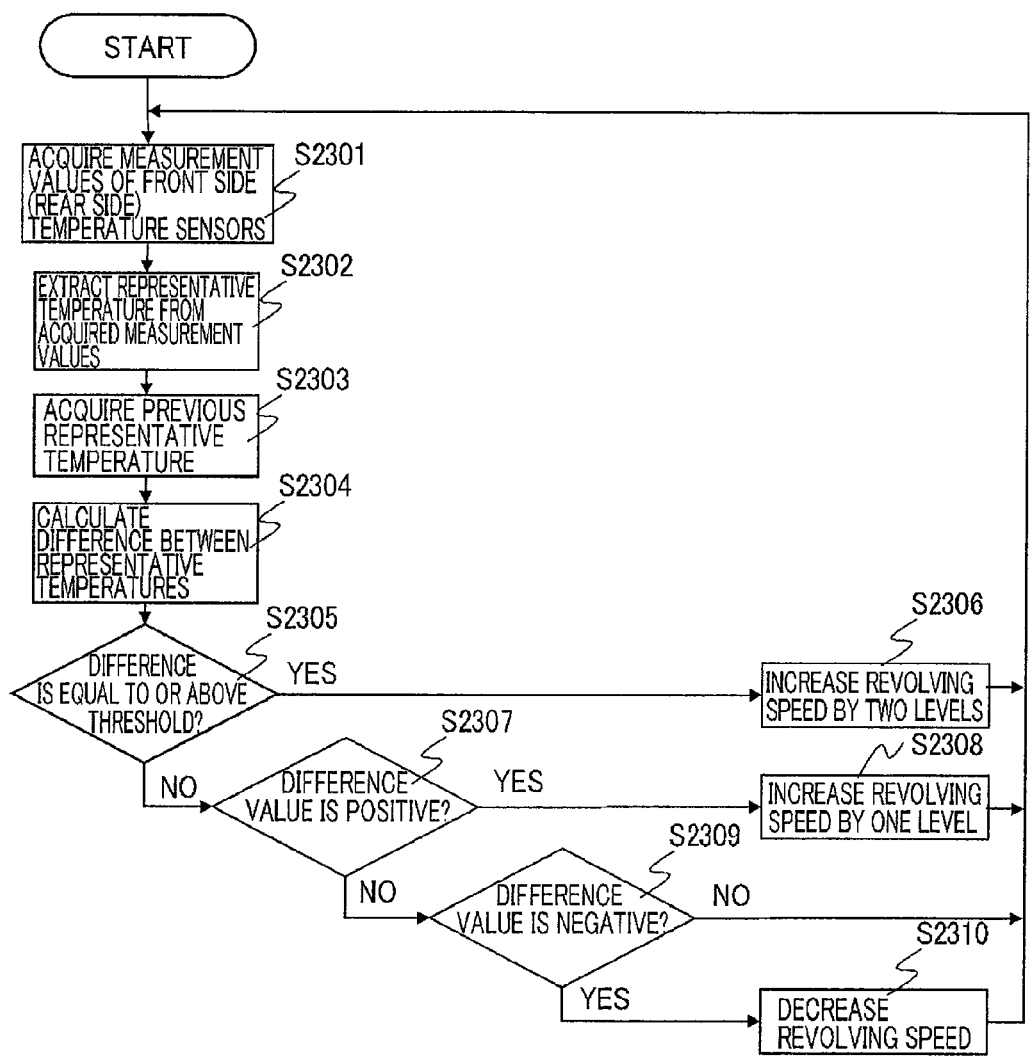

[Fig. 24]
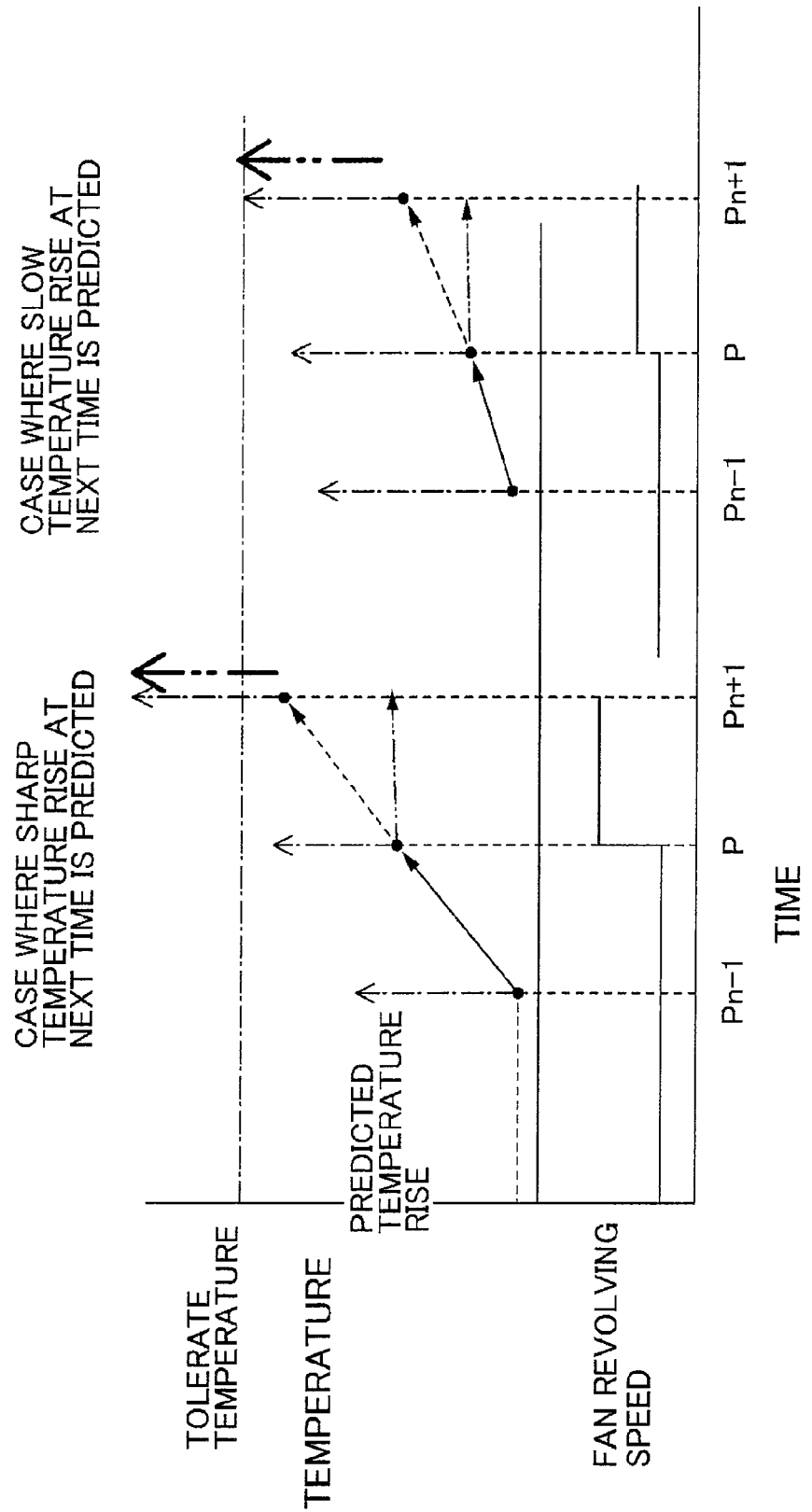

[Fig. 25]
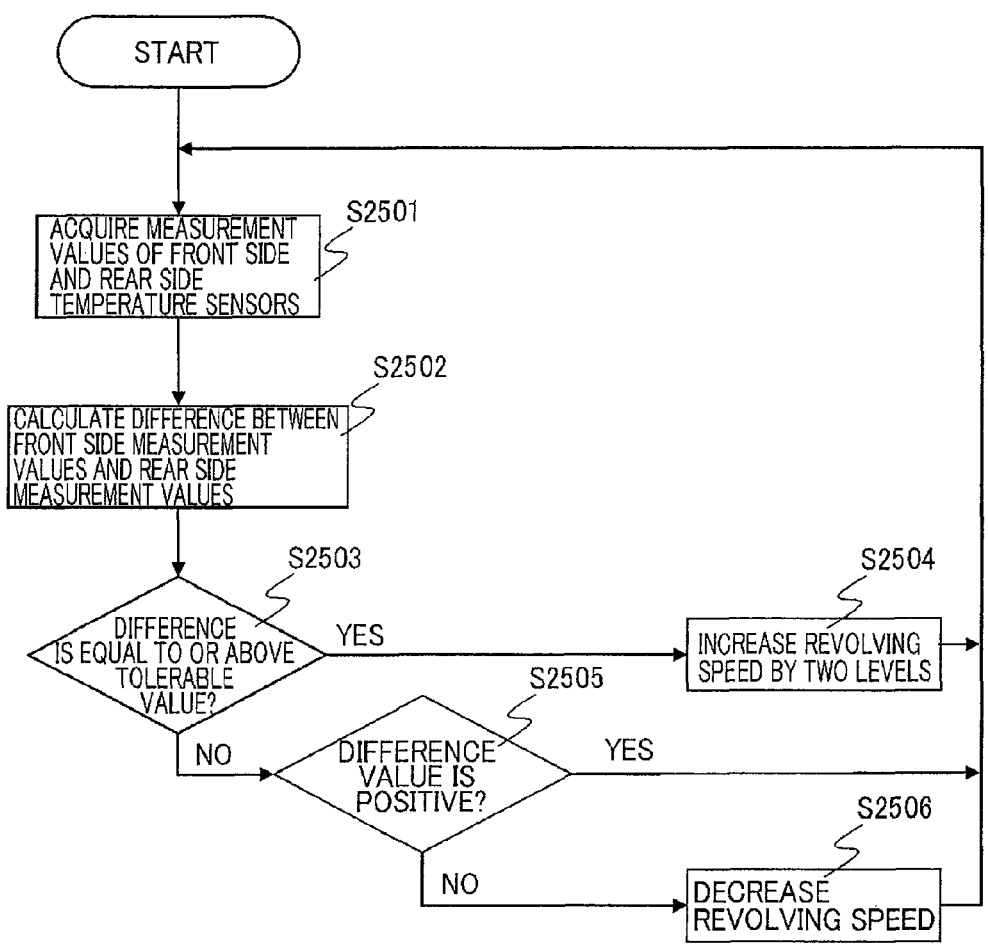

[Fig. 26]
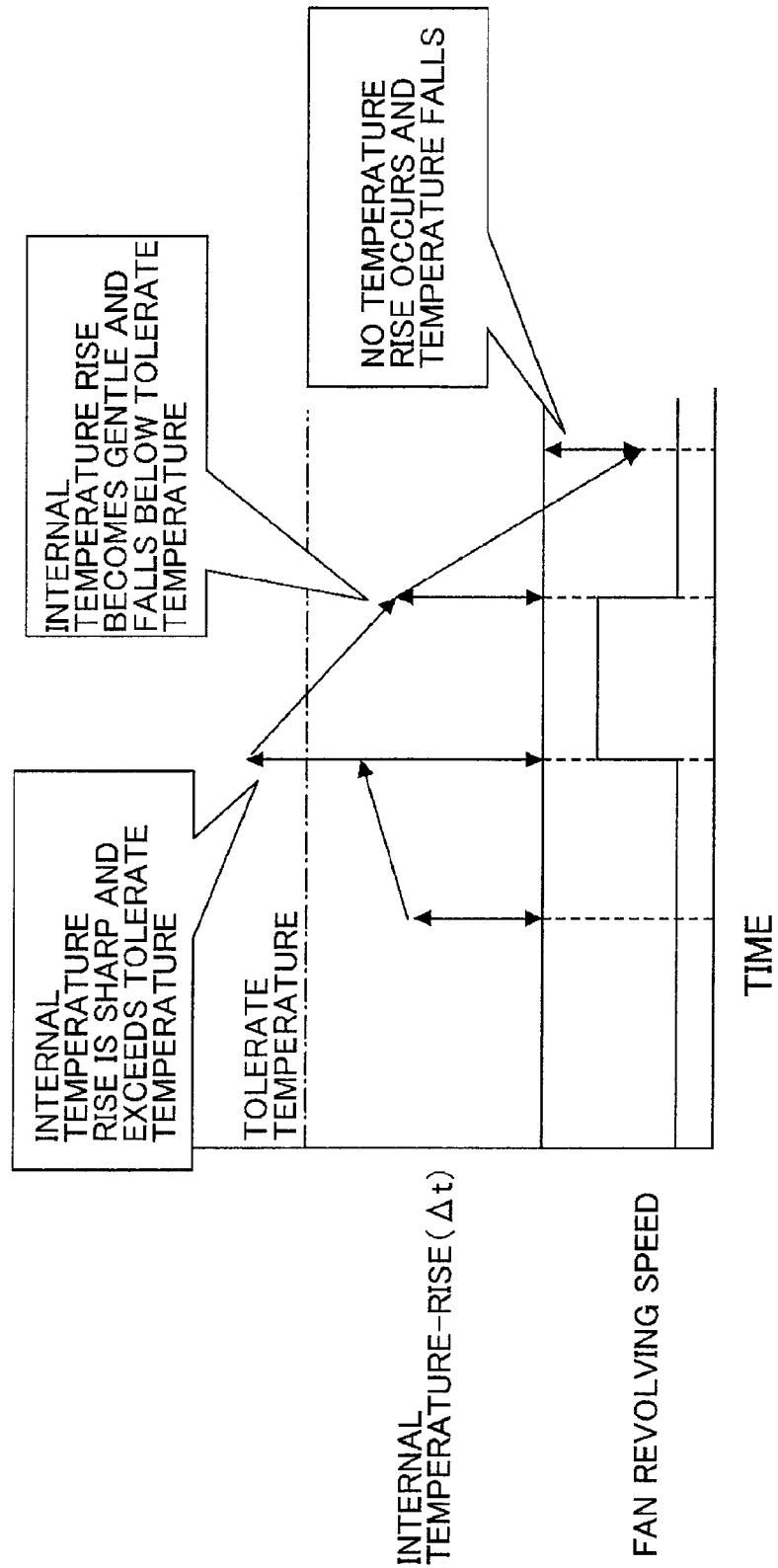

[Fig. 27]
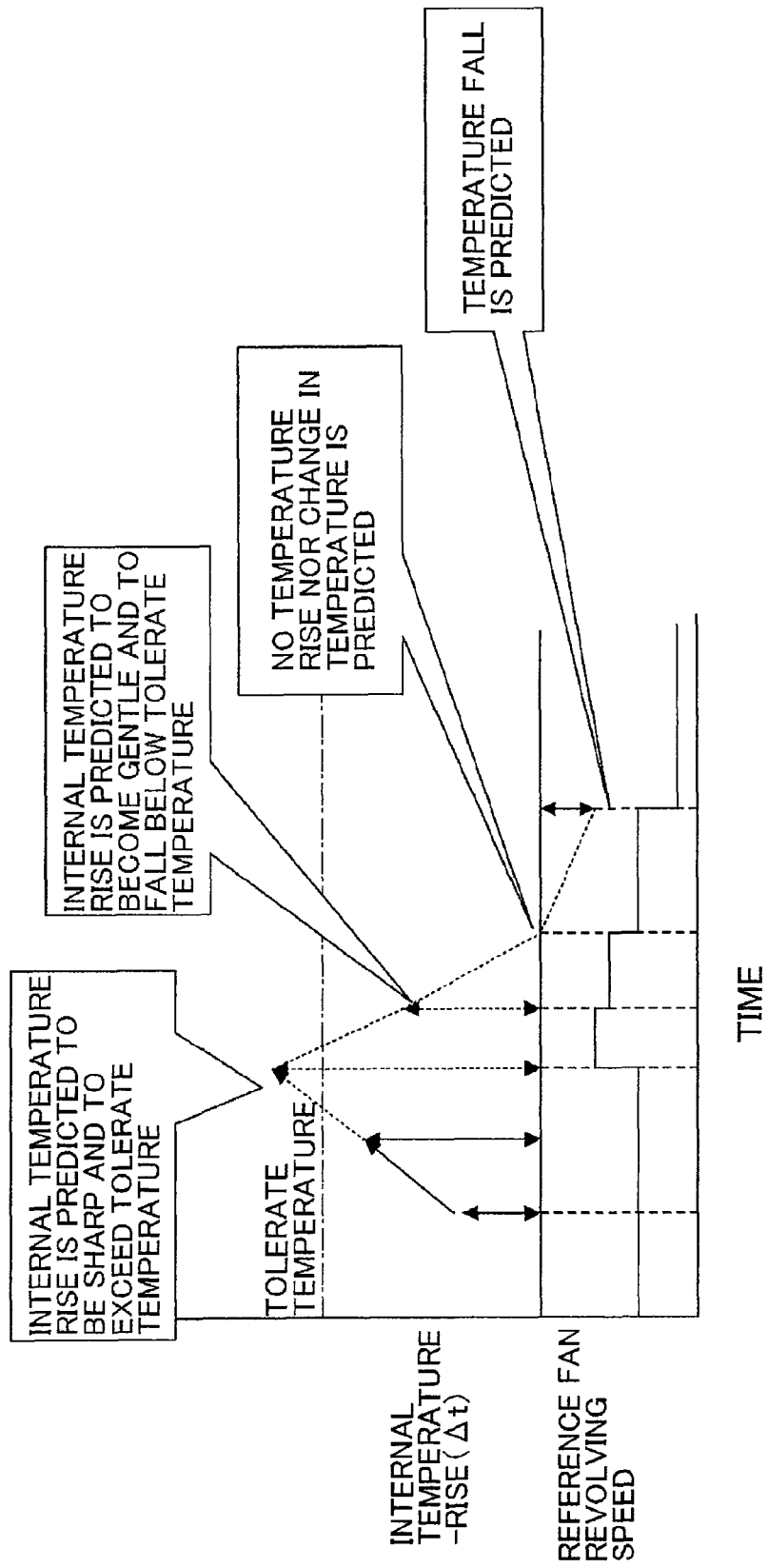

[Fig. 28]
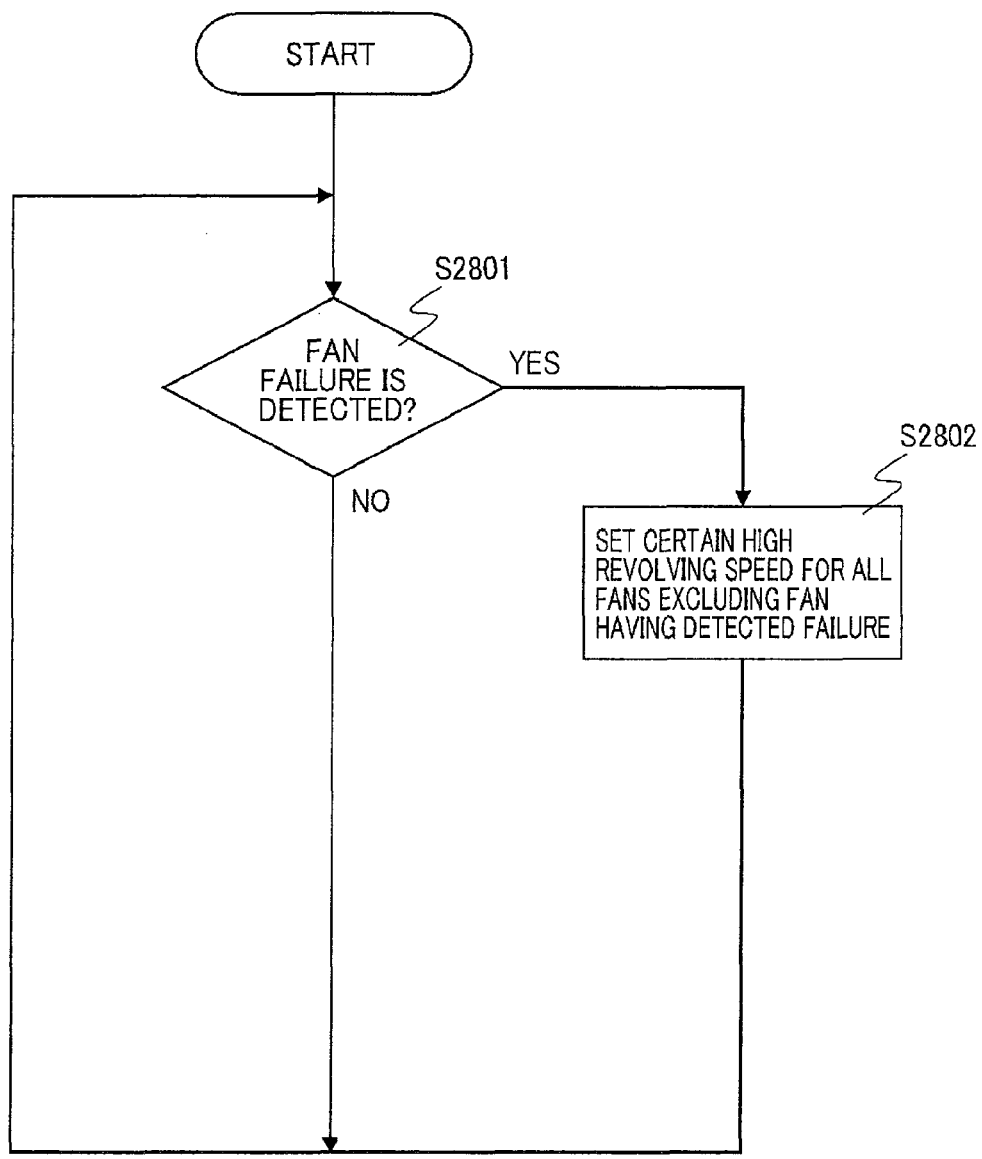

[Fig. 29]
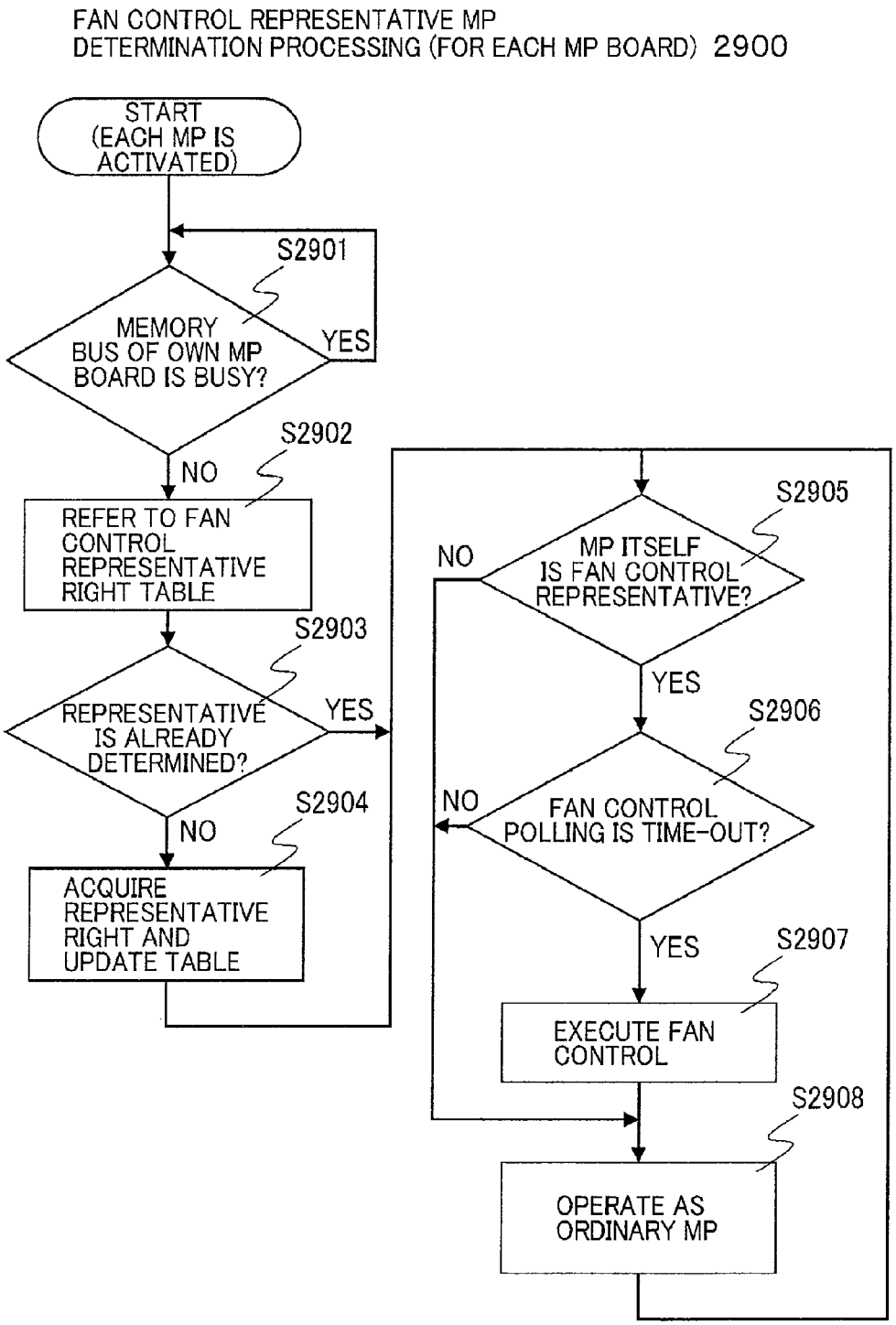

[Fig. 30]
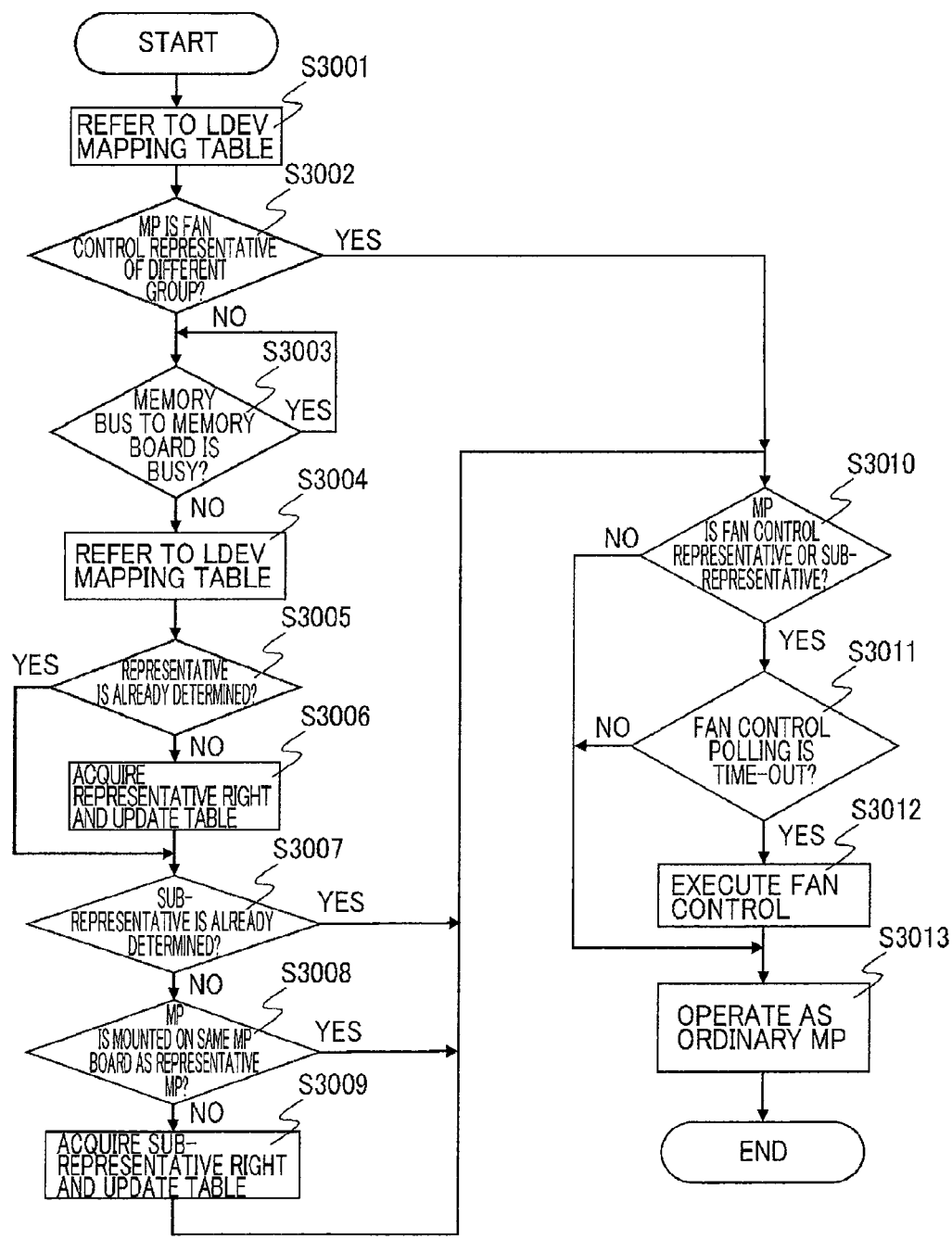

[Fig. 31]
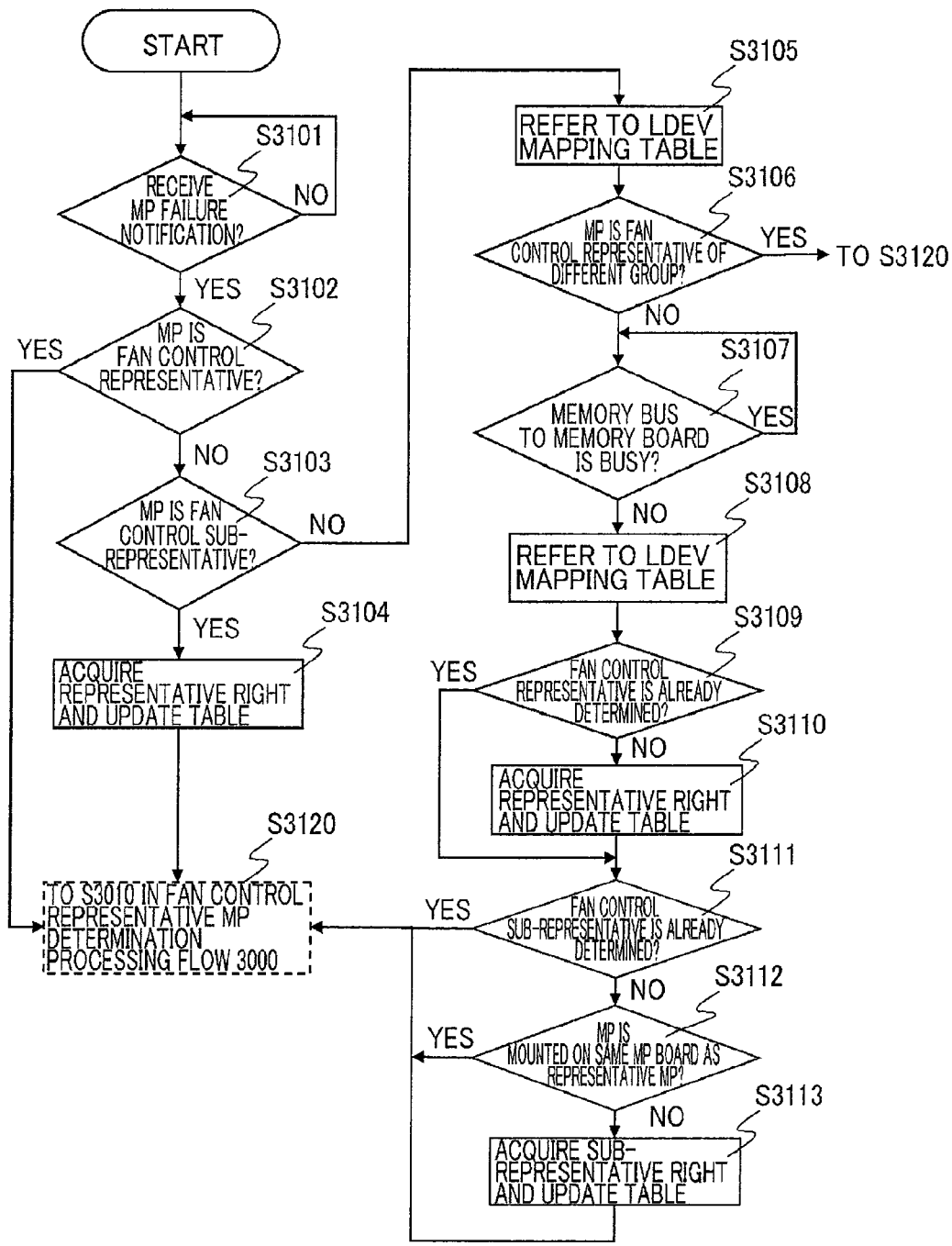

STORAGE APPARATUS AND METHOD OF CONTROLLING COOLING FANS FOR STORAGE APPARATUS

TECHNICAL FIELD

The present invention relates to a storage apparatus and a method of controlling cooling fans for a storage apparatus, and particularly relates to a storage apparatus and a method of controlling cooling fans for a storage apparatus which are capable of efficiently cooling a device embedded in the storage apparatus, depending on a surrounding environment of a location where the storage apparatus is operating and an operating status of the storage apparatus.

BACKGROUND ART

A storage apparatus is an apparatus including a storage medium such as a hard disk drive (hereinafter, "HDD") or a solid state drive (hereinafter, "SSD") and providing a storage area for data to be processed by an application and other programs running on a host computer or the like, and is also referred to as a disk subsystem.

In recent years, there has been an increasing demand that information apparatuses should save power consumption more than ever. In this regard, storage apparatuses have been also required to accomplish power consumption saving, space saving, high-density packaging, and noise reduction.

One of the great challenges for meeting these demands is how to control operations of a large number of electric cooling fans (hereinafter, simply called "fans") provided for cooling internal devices in a storage apparatus. Conventionally and generally, fans provided in a storage apparatus are controlled to start operating upon powering the storage apparatus on, and to always operate at the maximum rated speed while the storage apparatus is running. Such control method, however, poses a problem that, all the time during the operation, all the fans consume the maximum amount of power regardless of the surrounding environment, operating status and other conditions of the storage apparatus. In addition, other problems also arise that all the fans always generate the maximum operating noise, and that, all the time during the operation, the maximum mechanical load is applied on mechanical components such as a bearing included in a revolution mechanism for each of the fans, which in turn deteriorates the mechanical components and consequently shortens the lifetime of the fan.

In this regard, Patent Literature (PTL) 1 proposes a configuration capable of switching an operating state of a fan between high-speed revolution and low-speed revolution according to an operation mode of a control device to be cooled by the fan.

CITATION LIST

Patent Literature

[PTL 1]
Japanese Patent Application Laid-open Publication No 2007-142047

SUMMARY OF INVENTION

Technical Problem

The configuration proposed in PTL 1, however, only controls an operating mode of the fan between two modes classified as a normal mode and a standby mode, and therefore is still insufficient to meet the aforementioned recent strenuous demands on power consumption saving.

The present invention has been made in consideration of the foregoing problems, and one of the objects of the present invention is to provide a storage apparatus and a method of controlling cooling fans for a storage apparatus which are capable of efficiently cooling a device embedded in the storage apparatus, depending on a surrounding environment of a location where the storage apparatus is operating and an operating status of the storage apparatus.

Solution to Problems

In order to solve the foregoing and other problems, a first aspect of the present invention is a storage apparatus including: a storage drive configured to provide a physical storage area for creating a logical storage area to be used by an external apparatus; a storage controller including a plurality of central processing units configured to execute data write processing from the external apparatus to the storage drive, and data read processing from the storage drive; a plurality of cooling fans configured to cool the storage drive; a temperature sensor configured to detect a temperature of air introduced or discharged by the cooling fans; and a revolving speed sensor configured to detect a revolving speed of each of the cooling fans. In the storage apparatus, any one of the plurality of central processing units executes operation control processing in which measurement values of the temperature sensor and the revolving speed sensor are acquired through a data network path to the storage drive for the data write processing and the data read processing, and in which a revolving speed setup value of the cooling fans calculated based on the measurement values of the temperature sensor and the revolving speed sensor is transmitted to the cooling fans through the data network path.

Other matters such as objects and solutions disclosed in the present application will be clarified in the following section of "Description of Embodiments" and the drawings.

Advantageous Effects of Invention

According to the present invention, provided are a storage apparatus and a method of controlling cooling fans for a storage apparatus which are capable of efficiently cooling a device embedded in the storage apparatus, depending on a surrounding environment of a location where the storage apparatus is operating and an operating status of the storage apparatus.

BRIEF DESCRIPTION OF DRAWINGS

FIG. 1 is a view of an external appearance of a storage apparatus 10 according to an embodiment of the present invention.

FIG. 2 is a view of an external appearance of a controller device 100 included in the storage apparatus 10 according to an embodiment of the present invention.

FIG. 3 is a view of an external appearance of a drive unit device 200 included in the storage apparatus 10 according to an embodiment of the present invention.

FIG. 4A is a diagram of a front-side device layout of a drive unit device 200.

FIG. 4B is another diagram of the front-side device layout of the drive unit device 200.

FIG. 5A is a diagram of a rear-side device layout of the drive unit device 200.

FIG. 5B is another diagram of the rear-side device layout of the drive unit device 200.

FIG. 6 is a schematic longitudinal sectional view of the drive unit device 200.

FIG. 7 is a hardware configuration diagram of the storage apparatus 10.

FIG. 8 is a hardware configuration diagram of a host interface board 101 provided in the controller device 100.

FIG. 9 is a hardware configuration diagram of a switch board 102 and a memory board 103 provided in the controller device 100.

FIG. 10 is a hardware configuration diagram of an MP board 104 provided in the controller device 100.

FIG. 11 is a hardware configuration diagram of a drive control board 105 provided in the controller device 100.

FIG. 12 is a hardware configuration diagram of a drive board 201 provided in the drive unit device 200.

FIG. 13 is a software configuration diagram of the storage apparatus 10.

FIG. 14 is a diagram showing a structural example of an environment monitor database 1500.

FIG. 15 is a diagram showing a structural example of a conventional LDEV mapping table.

FIG. 16 is a diagram showing a structural example of an extended LDEV mapping table according to an embodiment of the present invention.

FIG. 17 is a schematic diagram showing an example of a conventional fan operation control system.

FIG. 18 is a schematic diagram showing an example of a fan operation control system according to the present embodiment.

FIG. 19 is a diagram showing an exemplary data write processing flow in the storage apparatus 10.

FIG. 20 is a diagram showing an exemplary data read processing flow in the storage apparatus 10.

FIG. 21 is a diagram showing an exemplary processing flow for detecting a fan revolving speed anomaly in the present embodiment.

FIG. 22 is a diagram showing an exemplary processing flow for controlling fan revolving speed in the present embodiment.

FIG. 23 is a diagram showing an exemplary processing flow for controlling fan revolving speed in the present embodiment.

FIG. 24 is a schematic diagram showing an exemplary control in an intake air temperature change prediction based control scheme.

FIG. 25 is a diagram showing an exemplary processing flow for controlling fan revolving speed in the present embodiment.

FIG. 26 is a schematic diagram showing an exemplary control based on a value of internal temperature-rise.

FIG. 27 is a schematic diagram showing an exemplary control in a control scheme based on prediction of a change in intake air temperature-exhaust air temperature difference.

FIG. 28 is a diagram showing an exemplary processing flow at the time of detecting a fan failure in the present embodiment.

FIG. 29 is an exemplary processing flow for determining a fan control representative MP in the present embodiment.

FIG. 30 is an exemplary processing flow for determining the fan control representative MP in the present embodiment.

FIG. 31 is an exemplary processing flow for determining the fan control representative MP in the present embodiment.

DESCRIPTION OF EMBODIMENTS

Hereinafter, with reference to the accompanying drawings, the present invention will be described based on embodiments of the present invention.

Overview of Configuration of Storage Apparatus
Configuration of Storage Apparatus Firstly, a configuration of a storage apparatus 10 according to an embodiment will be described. FIG. 1 shows an exemplary external appearance of the storage apparatus 10 according to an embodiment of the present invention.

The storage apparatus 10 includes a rack R to which a controller device 100 and a plurality of drive unit devices 200 are detachably attached. Here, FIG. 1 shows the configuration in which the controller device 100 is provided in a lowest portion of the storage apparatus 10 and the plurality of drive unit devices 200 are arranged in a stacked manner above the controller device 100. However, the arrangement of the controller device 100 and the drive unit devices 200 is not limited to the example shown in FIG. 1.

The rack R includes a front-face portion R1 and a rear-face portion R2 located at the rear side of the front-face portion R1. As shown by hollow thick arrows in FIG. 1, cooling air for cooling the inside of the controller device 100 and the drive unit devices 200 is introduced from the front-face portion R1 of the rack R and is discharged from the rear-face portion R2 of the rack R.

FIG. 2 shows an exemplary external appearance of the controller device 100 included in the storage apparatus 10. The controller device 100 has a rack-mount type structure with an almost rectangular parallelepiped shape, and includes a chassis 110 formed into an almost rectangular tubular shape by assembling a plurality of almost-rectangular metal plates, circuit modules 120 housed inside the chassis 110, and fans 130 for cooling these circuit modules 120. As shown in FIG. 1, the controller device 100 is housed in the rack R together with the other drive unit devices 200.

The circuit modules 120 are circuit units each of which houses therein circuit components such as a processor, a memory, a network switch, and a network interface circuit for executing control of inputting and outputting data to and from a storage drive which will be described later. The fans 130 are electric cooling fans capable of exerting predetermined designed performance, and are arranged in a pattern shown in FIG. 2, for example.

The chassis 110 is configured with such a shape and dimensions that twelve units of the circuit modules 120 can be housed in a vertically stacked manner, but the configuration of the chassis 110 is not particularly limited to the illustrated one.

FIG. 3 shows an exemplary external appearance of one of the drive unit devices 200 included in the storage apparatus 10. The drive unit device 200 houses therein a storage drive such as an HDD that provides a physical storage area of the storage apparatus 10, an input-output control circuit thereof, and the like. The drive unit device 200 has a rack-mount type structure with an almost rectangular parallelepiped shape similar to the controller device 100, and includes chassis 210F, 210R each formed into an almost rectangular tubular shape by assembling a plurality of almost-rectangular metal plates.

The chassis 210F, 210R each include an internally-mounted storage drive (unillustrated), an internally-mounted circuit unit (unillustrated) including a storage drive control circuit, fans 231 and fan driving power supply units (hereinafter, "fan power supplies") 220 for driving the fans 231. The chassis 210F, 210R are configured with internal device layouts which are practically the same, and are coupled to each other at their rear faces to form a single drive unit device 200.

The fans 231 are electric fans for generating air flows for cooling internal devices, as described for the fans 130 of the controller device 100. In the drive unit device 200, the fans 231 have a function of cooling the embedded storage drive and the storage drive control circuit. Any type of fan appropriately selected from fans, such as an AC fan or a DC fan, generally used for cooling information apparatuses can be used as the fans 231. In addition, the fan 231 described here collectively means air blowing devices called other names such as a blower.

In the drive unit device 200 illustrated in FIG. 3, a fan unit 230 is formed by mounting two fans 231 on a unit member made of a synthetic resin or the like, and two fan units 230 are attached on each of the right and left sides of the front face of each of the chassis 210F, 210R. Thus, both the chassis 210F, 210R have a configuration in which four fans 231 arranged side by side vertically are attached on either side of the front face of the chassis. The fan power supplies 220 are placed in a center portion of the front face of the chassis 210F, 210R in such a manner as to be interposed between the fans 231 in the right-left direction. Two of the fan power supplies 220 are arranged side by side vertically, and supply operating voltages to each of the fans 231 in a dual system. For the fan power supplies 220, any type can be selected appropriately which is suitable for controlling the employed fans 231.

FIG. 4A and FIG. 4B show examples of front-side device layouts of the drive unit device 200, and FIG. 5A and FIG. 5B show examples of rear-side device layouts of the drive unit device 200. FIG. 4A shows the drive unit device 200 in which the fan units 230 are removed from the front side of the chassis 210F (210), and FIG. 4B shows the drive unit device 200 in which the fan units 230 are attached to the chassis 210F from the front side. FIG. 5A and FIG. 5B show the device layouts in the chassis 210R (210), and the device layout is the same as that in FIGS. 4A and 4B, respectively. For this reason, the device layout in the chassis 210R will be explained here with reference to FIG. 4A and FIG. 4B.

With reference to FIG. 4A, when viewed from the front side, two fan power supplies 220 are housed in the center and storage drives 202 are housed on both right and left sides inside the chassis 210F. In the example in FIG. 4A, two storage drives 202 are provided as a unit on either of the right and left sides, and each unit includes one or more HDDs housed therein. Note that, as described above, the storage drive 202 indicates storage devices using various types of storage media including a HDD and a SSD.

Two drive boards 201 are housed as a unit between the fan power supplies 220 and the storage drives 202. The drive boards 201 are configured to control input-output of the storage drives 202, and functions of the drive board 201 will be described later.

In contrast to FIG. 4A, FIG. 4B shows the device layout in which the fan units 230 are placed on the storage drives 202 and the drive boards 201 from the front side. The fan units 230 are each attached with a hinge to either of inner right and left faces of the chassis 210F. Thus, the fan unit 230 is configured to be opened frontward, thereby allowing the internal devices to be accessed from the front side of the chassis 210F. In addition, an opening and closing operation of each of the fan units 230 is linked with power supply control to the fan unit 230, which will be described later. When all the fan units 230 are closed and placed in predetermined operating positions, the four fans 231 are vertically arranged on either of the right and left sides on the chassis 210F of the drive unit device 200, when viewed from the front side, as has been described with FIG. 3.

The configuration of the chassis 210F described with reference to FIG. 4A and FIG. 4B is also practically applicable, as it is, to the configuration of the chassis 210R illustrated in FIGS. 5A and 5B. Accordingly, when the chassis 210F and the chassis 210R are coupled to each other at their rear faces to form the drive unit device 200 as shown in FIG. 3, the eight fans 231 provided in the chassis 210F respectively face the eight fans 231 provided in the chassis 210R, which generates eight cooling air flows passing through the drive unit device 200 from the front side to the rear side.

FIG. 6 shows a schematic longitudinal sectional view of the drive unit device 200. FIG. 6 schematically shows the longitudinal sectional view of the drive unit device 200 including the fan units 230 and the storage drives 202, and illustrates brackets 250 each having an approximately E-shaped cross section and holding the storage drives 202, and backboards 240 attached to rear faces of the brackets 250. Each of the backboards 240 is a wiring board including wirings and a conductive pattern mainly for electrical coupling between the storage drives 202 and the drive boards 201 and electrical coupling from the drive boards 201 to the controller device 100.

As shown in FIG. 6, the backboards 240 and the brackets 250 are provided with air-vent holes 260 located at positions corresponding to the eight fans 231 provided in each of the chassis 210F, 210R. These air-vent holes 260 allow cooling air to flow as follows. Specifically, the cooling air introduced inside the chassis 210F by the eight fans 231 provided in the chassis 210F cools the devices such as the storage drives 202 inside the chassis 210F, then enters the chassis 210R through the air-vent holes 260, cools the devices inside the chassis 210R, and thereafter is discharged from the chassis 210R by the fans 231 provided in the chassis 210R.

As has been described with FIG. 6, the drive unit device 200 in the present embodiment introduces air from the fans 231 on the front side of the chassis 210F and discharges the air from the fans 231 on the front side of the chassis 210R (that is the rear side of the drive unit device 200). For this reason, the revolution directions of the fans 231 provided to the chassis 210F, 210R are set to such directions that the fans 231 in the chassis 210F can introduce the air while the fans 231 in the chassis 210R can discharge the air. The setting of the revolution directions of the fans 231 as described above allows reduction in buzz, which is a factor of noise, generated by the air flow inside the chassis 210F, 210R.

System Configuration of Storage Apparatus 10

Next, a system configuration of the storage apparatus 10 in the present embodiment will be explained. FIG. 7 shows an exemplary hardware configuration of the storage apparatus 10. The storage apparatus 10 forms a storage system 1 while being communicatively coupled to at least one server system 2 through a communication network 3.

The communication network 3 includes a LAN (Local Area Network), a SAN (Storage Area Network), a WAN (Wide Area Network), the internet, a public telecommunication network, a lease line and the like. Communications through the communication network 3 are performed in conformity with protocols such as TCP/IP, iSCSI (internet Small Computer System Interface), Fibre Channel Protocol, FICON (Fibre Connection) (registered trademark), ESCON (Enterprise Systems Connection) (registered trademark), ACONARC (Advanced Connection Architecture) (registered trademark), and FIBARC (Fibre Connection Architecture) (registered trademark), for example.

The server system 2 (external apparatus) is an information apparatus (computer) using a logical storage area (data storage area) provided by the storage apparatus 10. The server system (or systems) 2 is configured with a personal computer, a main frame, an office computer or the like. When accessing the storage area, the server system 2 sends to the storage apparatus 10 a data frame (hereinafter, "frame") including a data I/O request (a data write request, a data read request or the like).

The storage apparatus 10 accesses a recording medium in response to the above described I/O request sent from the server system 2, and transmits data or a response to the server system 2. The storage apparatus 10 includes a controller device 100 and a drive unit device 200. In the example shown in FIG. 7, the storage apparatus 10 is provided with a single controller device 100 and a single drive unit device 200. Two or more of controller devices 100 and/or two or more of drive unit devices 200 may be provided and coupled, however, to improve processing performance.

The controller device 100 (storage controller) processes a data I/O request received from the server system 2, and executes data write processing, data read processing and other processing together with the drive unit device 200. In the present embodiment, the controller device 100 includes host interface boards (hereinafter, "host I/F boards") 101, switch boards 102, memory boards 103, MP (MicroProcessor) boards 104 and drive control boards 105. These boards are communicatively coupled to each other through internal networks 106 using communication protocols such as fibre channel, iSCSI and TCP/IP.

The host I/F boards 101 each receive a frame sent from the server system 2, and send to the server system 2 a frame including a response (for example, read data, a read completion report, a write completion report) resulting from the processing for the data I/O request included in the received frame. Here, the following description is provided on the assumption that the frame is a frame of fibre channel (FC frame (FC: Fibre Channel)).

The switch boards 102 are each configured with a high-speed cross-bar switch, for example, and execute switching for transfer of control commands and data between the host I/F boards 101, the memory boards 103, the MP boards 104 and the drive control boards 105.

The memory boards 103 are each configured with a fast access RAM (Random Access Memory), for example. The memory board 103 is provided with a cache memory which stores data such as data to be written to the storage drives (hereinafter, "write data"), and data read from the storage drives (hereinafter, "read data"), and also is provided with shared memory which stores various types of information (such as tables) used to control the storage apparatus 10.

The MP boards 104 (central processing unit boards) are each configured to execute processing for data transfer performed between the host I/F board 101, the drive control board 105 and the cache memory of the memory board 103, in response to the above data I/O request included in the frame received by the host I/F board 101. The MP board 104 executes processing such as: passing data (data read from the below-described storage drive 202 or data to be written to the storage drive 202) between the host I/F board 101 and the drive control board 105 through the cache memory; staging data to be stored in the cache memory (reading data from the storage drive 202) or destaging data stored in the cache memory (writing data to the storage drive 202. In addition, in the present embodiment, a microprocessor (hereinafter, "MP") (central processing unit) mounted on the MP board 104 performs operation control of the fans 231. The fan operation control by the MP will be described later.

The drive control boards 105 each communicate with a drive board 201 of the drive unit device 200 when reading data from the storage drive 202 and writing data to the storage drive 202.

The drive unit device 200 includes the drive boards 201 and a plurality of storage drives 202. The storage drives 202 each are a storage medium such as an HDD or SSD having an interface such as SAS (Serial Attached SCSI), SATA (Serial ATA), FC (Fibre Channel), PATA (Parallel ATA) or SCSI, for example. The drive board 201 executes processing of receiving data from the drive control board 105 of the controller device 100, and storing the data into the storage drive 202; processing for a control command received from the drive control board 105 of the controller device 100; and other processing. Note that, the drive boards 201 and the storage drives 202 may be provided in any number based on the design requirement or the like, regardless of the example shown in FIG. 7.

The drive unit device 200 provides a server system 2 with storage areas in units of logical storage areas provided by controlling the storage drives 202 in a method such as RAID (Redundant Arrays of Inexpensive (or Independent) Disks) or the like. The logical storage area is a logical device (Logical DEVice, hereinafter called "LDEV" (unit logical storage area)) which is configured with a RAID group (parity group), for example. In addition, the storage apparatus 10 provides the server system 2 with a logical storage area (Logical Unit or Logical Volume, hereinafter called "LU") (logical volume) configured with a LDEV. The storage apparatus 10 manages correspondence (relationship) between the LU and the LDEV, and identifies a LDEV corresponding to a LU or a LU corresponding to a LDEV, on the basis of the correspondence. A LDEV for data I/O processing is allocated to each of MPs mounted on the MP board 104, which will be described later.

FIG. 8 shows a hardware configuration of the host I/F board 101. As shown in FIG. 8, the host I/F board 101 includes an external network interface (hereinafter, "external network I/F") 1011 having a port (network port) for communicating with the server system 2, a processor 1012 (including a frame processing chip and a frame transfer chip to be described later), a memory 1013 and an internal network interface (hereinafter, "internal network I/F") 1014 having a port (network port) for communicating with the MP boards 104.

The external network I/F 1011 is configured with a NIC (Network Interface Card), a HBA (Host Bus Adaptor) or the like. The processor 1012 is configured with a CPU (Central Processing Unit), a MPU (Micro Processing Unit) or the like. The memory 1013 is a RAM (Random Access Memory) or a ROM (Read Only Memory). The memory 1013 stores a microprogram therein. The processor 1012 implements various types of functions provided by the host I/F board 101 by loading the microprogram from the memory 1013 and then executing the microprogram. The internal network I/F 1014 communicates with the MP boards 104, the drive control boards 105 and the memory boards 103 through the internal networks 106 and the switch boards 102.

FIG. 9 shows a hardware configuration of the switch board 102 and the memory board 103. As shown in FIG. 9, the switch board 102 and the memory board 103 include processors 1022, 1032, memories 1023, 1033 and internal network I/Fs 1021, 1031, respectively.

The processors 1022, 1032 are configured with a CPU, a MPU or the like. The memories 1023, 1033 are a RAM or a ROM. The memory 1023 of the switch board 102 stores therein a microprogram which is loaded and executed by the processor 1022 for implementing various types of switching functions. The memory 1033 of the memory board 103 is used as a cache memory and shared memory. The internal networks I/F 1021, 1031 communicate with the MP boards 104 and the drive control boards 105 through the internal networks 106 and the switchboards 102. Note that, the memory board 103 may not be necessarily equipped with the processor 1032, in particular.

FIG. 10 shows a hardware configuration of the MP board 104. The MP board 104 includes an internal network I/F 1041, MPs 1042, and a (fast access) memory 1043 (local memory) accessible at a higher speed from the MPs 1042 than the memory 1033 of the memory board 103. The memory 1043 stores a microprogram therein. The MPs 1042 implement various types of functions provided by the MP board 104 by loading the microprogram from the memory 1043 and then executing the microprogram.

The internal network I/F 1041 communicates with the host I/F boards 101, the drive control boards 105 and the memory boards 103 through the internal networks 106 and the switch boards 102. The MPs 1042 are configured with a CPU, a MPU, a DMA (Direct Memory Access) or the like. The memory 1043 is a RAM or a ROM. The MPs 1042 are capable of accessing any of the shared memories formed by the memory 1043 and the memories 1033 of the memory boards 103. In the example shown in FIG. 10, four MPs 1042 are mounted on a single MP board 104. However, the number of the mounted MPs 1042 can be determined appropriately according to the design requirements or the like.

FIG. 11 shows a hardware configuration of the drive control board 105. The drive control board 105 includes an internal network I/F 1051, a processor 1052, a memory 1053 and a drive control interface (hereinafter, "drive control I/F") 1054. The memory 1053 stores a microprogram therein. The processor 1052 implements various types of functions provided by the drive control board 105 by loading the microprogram from the memory 1053 and then executing the microprogram.

The internal network I/F 1051 communicates with the host I/F boards 101, the MP boards 104 and the cache memories and the shared memories formed by the memories 1033 of the memory boards 103, through the internal networks 106 and the switch boards 102. The processor 1052 is configured with a CPU, an MPU or the like. The memory 1053 is a RAM or ROM, for example. The drive control I/F 1054 communicates with the drive board 201 of the drive unit device 200.

FIG. 12 shows a hardware configuration of the drive board 201. The drive board 201 includes an internal network I/F 2011, a processor 2012, a memory 2013, a drive interface (hereinafter, "drive I/F") 2014 and an environment monitor circuit 2015. The memory 2013 stores a microprogram therein. The processor 2012 implements various types of functions provided by the drive board 201 by loading the microprogram from the memory 2013 and then executing the microprogram.

The internal network I/F 2011 communicates with the drive control board 105 of the controller device 100 through an inter-chassis wiring. The processor 2012 is configured with a CPU, an MPU or the like. The memory 2013 is a RAM or ROM, for example. The drive I/F 2014 communicates with the storage drives 202.

The environment monitor circuit 2015 monitors the operating status of the storage apparatus 10 in real time, and acquires at any time measurement values sent from sensors installed in various positions in the storage apparatus 10. The sensors include, for example, a temperature sensor, a voltage sensor, a current sensor, a frost sensor and a revolving speed sensor that measures the number of revolutions of the fans 231. The environment monitor circuit 2015 is configured with a one-chip microcomputer in which a CPU and memory are packaged as a single unit, for example.

As will be described later, the fan operation control in the present embodiment uses temperature measurement values indicative of temperatures inside and outside the storage apparatus 10 and fan revolving speed measurement values, these values being acquired by the environment monitor circuit 2015. The environment monitor circuit 2015 communicates with the MPs 1042 on the MP boards 104 executing the fan operation control, and performs the communications using frames which are used for data input/output to and from the storage drive 202. For example, the environment monitor circuit 2015 can use a spare data area in an SAS based frame to provide the MPs 1042 with data of temperature measurement values and fan revolving speed measurement values. Therefore, there is no need to provide a dedicated network line between the MP boards 104 and the environment monitor circuit 2015. This produces an effect of simplifying internal wiring in the storage apparatus 10.

Here, return to FIG. 7. A maintenance device 300 controls component elements in the storage apparatus 10 and monitors the states of the component elements. The maintenance device 300 is a personal computer, an office computer or the like. The maintenance device 300 communicates with the component elements in the storage apparatus 10, such as the host I/F boards 101, the MP boards 104, the drive control boards 105, the memory boards 103 and the switchboards 10, through network means such as the internal networks 106 and a LAN 107 at any time, thereby acquires operation information or the like from each of the component elements, and then provides the operation information to a management device 4. In addition, the maintenance device 300 makes setting and performs control and maintenance (including new installation and update of software) of each of the component elements on the basis of the operation information and control information transmitted from the management device 4.

The management device 4 is a computer communicatively coupled to the maintenance device 300 through a LAN or the like. The management device 4 includes user interfaces using GUI (Graphical User Interface), CLI (Command Line Interface) or the like for controlling and monitoring the storage apparatus 10.

Next, a software configuration of the storage apparatus 10 will be described. FIG. 13 shows an exemplary software configuration of the storage apparatus 10. As shown in FIG. 13, the storage apparatus 10 includes an I/O processing unit 1100, a storage area management unit 1200, a fan management unit 1300 and a fan controlling MP management unit 1400.

The I/O processing unit 1100 includes a data write processing unit 1101 that performs processing for writing to the drive unit device 200, and a data read processing unit 1102 that performs processing for reading data from the drive unit device 200.

The storage area management unit 1200 is provided to allow the MPs 1042 mounted on each of the MP boards 104 in the controller device 100 to perform data input/output processing on their corresponding LDEVs. Specifically, according to an instruction from the storage area management unit 1200, each of the MPs 1042 executes processing on the corresponding LDEV in reference to an extended LDEV mapping table 1600, which will be described later.

The fan management unit 1300 includes an anomaly detecting unit 1301 and a revolving speed controlling unit 1302. The anomaly detecting unit 1301 detects an anomaly in the fans 231 on the basis of information on the operating states of the fans 231 acquired from each of the fan units 230 through the environment monitor circuits 2105, and executes processing to deal with the detected anomaly. The revolving speed controlling unit 1302 controls the revolving speed of the fans 231 on the basis of the temperature measurement values and the revolving speed measurement values of the fans 231 acquired from each of the fan units 230 through the environment monitor circuits 2105.

The fan controlling MP management unit 1400 executes processing of determining which MP 1042 among the MPs 1042 mounted in the controller device 100 is to be in charge of controlling the operation of the fans 231.

Note that, functions of the I/O processing unit 1100, the storage area management unit 1200, the fan management unit 1300 and the fan controlling MP management unit 1400 are implemented in such a way that the hardware included in the host I/F boards 101, the drive control boards 105 and the like in the storage apparatus 10, or any of the MPs 1042 mounted on the MP boards 104 loads and executes the microprogram stored in the memory 1043.

The storage apparatus 10 holds an environment monitor database 1500 and an extended LDEV mapping table 1600 used to execute the fan control operation of the present embodiment. FIG. 14 shows a structure example of the environment monitor database 1500, FIG. 15 shows a structure example of a conventional LDEV mapping table, and FIG. 16 shows a structure example of the extended LDEV mapping table 1600 in the present embodiment.

The environment monitor database 1500 is a database created by recording at certain time intervals the measurement values acquired from various sensors by the environment monitor circuits 2015 as needed. The environment monitor database 1500 is set in advance in the shared memory formed by the memory 1033 mounted on a memory board 103, for example. In the example in FIG. 14, the environment monitor database 1500 includes records each having recorded items such as a number 1501 that is an identification number assigned in chronological order, a fan revolving speed 1502 (unit: rpm) acquired for each of the fans (F) 231 and a temperature measurement value 1503 (unit: degrees centigrade) acquired for each of the fan units (FU) 230. The fan revolving speeds 1502 and the temperature measurement values 1503 are acquired by the environment monitor circuits 2015 at certain time intervals, for example, every 10 minutes, and are sequentially recorded in the environment monitor database 1500 with the number 1501 attached thereto. The MP 1042 in charge of the fan operation control makes an inquiry to the environment monitor database 1500, thereby acquires the revolving speeds 1502 and the temperature measurement values 1503 of the fans 231 and controls the operation of the fans 231 on the basis of the information thus acquired. Since the fan revolving speeds 1502 are recorded with time, the MP 1042 can detect a phenomenon in which the revolving speed of each of the fans 231 decreases over time. This allows detection of a deterioration in the performance of the fan 231, and provision of preventive maintenance.

Subsequently, the extended LDEV mapping table 1600 will be explained. As has been described for the configuration of the controller device 100, each of the LDEVs created from the storage drives 202 is assigned the MP 1042 in charge of data processing on the LDEV in order to make a balance of data processing load among the plurality of MPs 1042. FIG. 15 shows a conventional example in which LDEV numbers 1601 set as respective logical storage areas, and MP numbers 1602 that are identification codes given to the MPs 1042 in charge of the logical storage areas are recorded in association with each other. For each MP 1042, 1 is recorded in a cell of the LDEV number 1601 to be taken care of by the MP 1042. In reference to the LDEV mapping table 1600, each of the MPs 1042 discriminates data I/O to be processed by itself.

FIG. 16 shows the extended LDEV mapping table 1600 used in the present embodiment. In the extended LDEV mapping table 1600, items of an ownership 1603, a fan control representative 1604 and a fan control sub-representative 1605 are set in association with each LDEV number 1601. If each MP number 1602 is set to have 1 in the cell of the ownership 1603, this means that the corresponding MP 1042 is assigned to execute data processing on the LDEV identified by the corresponding LDEV number 1601. In addition, if each MP number 1602 is set to have 1 in the cell of the corresponding fan control representative 1604 or the fan control sub-representative 1605, this means that the MP 1042 identified by the MP number 1602 is designated as a fan control representative or a fan control sub-representative. The definitions of the fan control representative and the fan control sub-representative will be described in detail in connection with determination processing of these representatives.

Fan Operation Control System

Next, a fan operation control system implemented in the storage apparatus 10 having the foregoing configuration will be described in comparison with a typical conventional example. FIG. 17 shows an example of a conventional fan operation control system.

In the example in FIG. 17, a basic configuration as a storage apparatus 10 is almost the same as that of the present invention illustrated in FIG. 7, but each of drive control boards 105 is equipped with one of MPs 104 in a dual system in charge of data I/O to and from the storage drives 202. In addition, each of the drive control boards 105 is provided with an environment monitor control circuit 1055 that acquires various measurement values collected by an environment monitor circuit 2015 provided on a drive board 201, and passes the various measurement values to the MP 104. A dedicated network line is provided between the environment monitor control circuit 1055 and the environment monitor circuit 2015, and the various measurement values are transmitted and received by using appropriate communication protocol.

In this configuration, when the storage apparatus 10 is powered on, the MP 104 makes an instruction to power on a fan power supply 203 through the environment monitor control circuit 1055 and the environment monitor circuit 2015, and thereby the fan power supply 203 supplies a driving power source to each of fans 231. As has been described in the section of background art, each fan 231 operates at a certain maximum rated speed while the storage apparatus 10 is running, and continues the operation until the driving power supply from the fan power supply 203 is stopped in response to shutdown (power-off) of the storage apparatus 10.

Meanwhile, the operating state of each fan 231 is monitored by the MP 104 through an anomaly warning signal outputted from the fan 231, but the various measurement values collected through the environment monitor circuit 2015 and the environment monitor control circuit 1055 are not reflected in the operation control of the fan 231. To be more precise, the MP 104 monitors the operating state of each fan 231 (whether the fan 231 operates normally or not) by using the fan anomaly warning signal transmitted from the fan 231 through the environment monitor circuit 2015 and the environment monitor control circuit 1055. When the MP 104 detects the fan anomaly warning signal from the fan 231, the MP 104 notifies the maintenance device 300 of this detection. The maintenance device 300 having received the fan anomaly warning signal from the MP 104 notifies the management device 4 that an anomaly occurs in the fan 231.

In contrast to the above typical conventional example, FIG. 18 shows an example of a fan operation control system in the present embodiment. Unlike the configuration example in FIG. 17, MPs 1042 in charge of data I/O to and from storage drives 202 are mounted on each MP board 104, independently. In the example in FIG. 18, an MP board 104 is provided for each power supply system in a storage apparatus 10, and is equipped with four MPs 1042. In the present embodiment, one of the MPs 1042 is selected as the fan control representative MP and is in charge of the operation control of the fan 231, as will be described later. A drive control board 105 does not include a circuit equivalent to the environment monitor control circuit 1055 in FIG. 17. A network interface (such as fiber channel, SAS, and SATA) for data I/O to and from the storage drive 202, which is implemented between a drive control I/F 1054 and a drive I/F 2014, is used to transmit various measurement values between an environment monitor circuit 2015 and the MP 1042 and to issue operation instructions to the fans 231.

As has been described in relation to FIG. 3 and the like, two fans 231 are collectively mounted in a single fan unit 230. Fan power supplies 203 are coupled to different apparatus power supply systems, respectively, to secure redundancy, and are coupled to a fan driver 232 through an open-close linked switch 233. The open-close linked switch 233 is opened and closed according to an output signal from an open-close sensor 234 that is a proximity sensor or the like for detecting whether the fan unit 230 is opened or is closed with respect to the chassis 210. When the open-close sensor 234 detects an open state of the fan unit 230 (a state where the fan unit 230 is opened outwardly to allow an access to an internal device in the chassis 210), the open-close sensor 234 outputs an open-state detection signal, and thereby opens the open-close linked switch 233. Thereby, when a fan unit 230 is opened, the power supply to the fan unit 230 is stopped.

The fan driver 232 is a circuit for adjusting a voltage, frequency and the like of the driving power to be supplied to each fan 231 in order to control the revolving speed of the fan 231 by using the power supply from the fan power supplies 203, and a control signal received from the MP 1042 in charge of fan operation control through the drive control I/F 1054, the drive I/F 2014 and the environment monitor circuit 2015. Note that it is also possible to employ another configuration in which the MP 1042 adjusts the output voltage or the like of the fan power supplies 203 through the drive control I/F 1054, the drive I/F 2014 and the environment monitor circuit 2015, and thereby controls the revolving speed of the fans 231 in the whole chassis 210.

Each fan unit 230 is provided with a temperature sensor 235 that outputs as an electric signal a measurement value of an ambient temperature. The measurement value of the ambient temperature is acquired at certain time intervals by the environment monitor circuit 2015, and is recorded in the environment monitor database 1500. Moreover, the revolving speed of each fan 231 is acquired by the environment monitor circuit 2015 at certain time intervals from the revolving speed sensor provided to each fan 231 and is similarly recorded in the environment monitor database 1500. The MP 1042 in charge of fan operation control accesses the environment monitor database 1500 at proper time intervals through the drive control I/F 1054, the drive I/F 2014 and the environment monitor circuit 2015, acquires the temperature measurement value and the revolving speed measurement value, and executes the fan operation control on the basis of the values thus acquired.

Data I/O Processing of Storage Apparatus 10

Next, data I/O processing on the storage drives 202 executed by the storage apparatus 10 having the foregoing configuration will be described. This data I/O processing is general processing executed by the storage apparatus 10.

FIG. 19 is a flowchart for explaining processing (hereinafter, "data write processing 1900") that the data write processing unit 1101 of the I/O processing unit 1100 executes when the storage apparatus 10 receives a frame including a data write request from the server system 2. Hereinafter, the data write processing 1900 will be described with reference to FIG. 19. In the following explanation, the letter "S" attached in front of a reference number denotes step.

A frame sent from the server system 2 is received by the host I/F board 101 of the storage apparatus 10 (S1901, S1902). Upon receipt of the frame, the host I/F board 101 notifies the MP board 104 of the reception (S1903).

Upon receipt of the notification from the host I/F board 101 (S1904), the MP board 104 generates a drive write request based on the data write request in the frame, and stores the generated drive write request in the memory 1033 (cache memory) of the memory board 103. Then, the MP board 104 transmits the generated drive write request to the drive board 201 (S1908). The host I/F board 101 transmits a completion report to the server system 2 (S1906), and the server system 2 receives the completion report (S1907).

The drive board 201 receives the drive write request and then registers the request in a write processing waiting queue (S1909). The drive board 201 reads the drive write request from the write processing waiting queue as needed (S1910). The drive board 201 reads write data specified by the read drive write request from the memory 1033, and writes the read write data into the storage drive 202 (S1911).

After that, the drive board 201 notifies the MP board 104 a report (completion report) indicating a completion of writing of the write data for the drive write request (S1912), and the MP board 104 receives the sent completion report (S1913).

FIG. 20 is a flowchart for explaining I/O processing (hereinafter, "data read processing 2000") that the data read processing unit 1102 of the I/O processing unit 1100 of the storage apparatus 10 executes when the storage apparatus 10 receives a frame including a data read request from the server system 2. Hereinafter, the data read processing 2000 will be described with reference to FIG. 20.

A frame sent from the server system 2 is received by the host I/F board 101 of the storage apparatus 10 (S2001, S2002). Upon receipt of the frame from the server system 2, the host I/F board 101 notifies the drive board 201 of the reception (S2003).

Upon receipt of the notification from the host I/F board 101, the drive board 201 reads from the storage drive 202 the data specified by the data read request included in the frame (for example, data specified with a LBA (Logical Block Address)) (S2004). When the read data is present in the memory 1033 (cache memory) of the memory board 103 (i.e., in case of a cache hit), the read processing (S2004) from the storage drive 202 is omitted. The MP board 104 writes the data read by the drive board 201 into the cache memory (S2005). The MP board 104 transfers the data written into the cache memory to the host I/F board 101 as needed (S2006).

The host I/F board 101 sequentially sends the read data, which is sent from the MP board 104, to the server system 2 (S2007, S2008). Upon completion of the sending of the read data, the host I/F board 101 sends a completion report to the server apparatus 3 (S2009), and the server system 2 receives the sent completion report (S2010).

Fan Operation Control Processing

Next, fan operation control executed by the foregoing configuration according to the present embodiment will be described in more detail with reference to processing flows thereof.

Fan Anomaly Detection Processing

FIG. 21 shows an exemplary processing flow of the revolving speed anomaly detection processing of the fans 231. This revolving speed anomaly detection processing is executed by the anomaly detecting unit 1301 of the fan management unit 1300 implemented by the MP 1042.

In the first place, the anomaly detecting unit 1301 accesses the environment monitor database 1500 retained by the environment monitor circuit 2015 through the drive control I/F 1054 and the drive I/F 2014 at predetermined time intervals, and thereby acquires the latest revolving speed measurement value 1502 recorded for each of the fans 231 (the measurement value with the largest number 1501 for each of the fans 231) (S2101). Secondly, the anomaly detecting unit 1301 determines whether the revolving speed measurement value 1502 acquired for each of the fans 231 is equal to or above a threshold (S2102). Here, the threshold is set by the anomaly detecting unit 1301 itself for a setup revolving speed and is retained in the memory 1043 of the MP board 104, for example (90% of the setup revolving speed, for example). When judging that the revolving speed measurement value 1502 is equal to or above the threshold (S2102: Yes), the anomaly detecting unit 1301 determines that the revolving speed of the fan 231 targeted for the judgment is normal, and then terminates the processing (S2103). On the other hand, when judging that the revolving speed measurement value 1502 is below the threshold in S2102 (S2102: No), the anomaly detecting unit 1301 determines that something wrong with the fan 231 targeted for the judgment occurs to decrease the revolving speed (S2104), and then sends the maintenance device 300 information indicating that fact (S2105).

Through the above processing, it is possible to detect that the revolving speed falls below the setup value because of the occurrence of a certain trouble in the fan 231. Thus, preventive maintenance can be performed on the fan 231 before the fan 231 stops operating completely due to malfunctioning.

Note that, in addition to the above judgment using the threshold, the fan anomaly detection processing may involve judging whether or not the revolving speed measurement value 1502 is 0. In this case, a detection can be made for a state in which the fan 231 is stopped by the open-close linked switch 233 because the fan unit 230 is opened.

Fan Revolving Speed Control Processing

Next, processing of controlling the revolving speed of the fans 231 according to the ambient temperature of the fans 231 will be described on a control scheme basis with reference to processing flows of control schemes. Each type of the revolving speed control processing is executed by the revolving speed controlling unit 1302 of the fan management unit 1300 implemented by the MP 1042.

Intake Air Temperature Based Control Scheme

FIG. 22 shows an exemplary processing flow of fan revolving speed control processing based on a temperature of ambient air introduced into the chassis 210 by the fans 231. In the example in FIG. 22, judgment thresholds for the intake air temperature are set at three degrees T1, T2, T3 each having a hysteresis of T1L to T1H, T2L to T2H, or T3L to T3H (where T1L<T1H<T2L<T2H<T3L<T3H) and the fan revolving speed is changed among three levels of SP1, SP2, SP3 (where SP1<SP2<SP3) according to the temperature condition. The hysteresis is given for preventing the fan revolving speed setup value from changing frequently at temperature around the judgment threshold, and thereby for leading to a stable operation. The number of temperature judgment thresholds and the levels of the fan revolving speed may be changed as needed according to the performance condition or the like that the storage apparatus 10 is required to satisfy. Note that, for simplification, FIG. 22 shows the flow in which the hystereses of T1 and T3 are omitted.

In addition, the temperature sensor 235 is provided to each of the fan units 230. In order to absorb the distribution of the measurement values acquired by the temperature sensors 235, a temperature representative value (hereinafter, "a representative temperature") for controlling the four fan units 230 on the front side of the chassis 210 shown in FIG. 3 and the like is determined by taking the largest value or calculating the mean value of the measurement values of the four temperature sensors 235.

In the first place, the revolving speed controlling unit 1302 accesses the environment monitor database 1500 held by the environment monitor circuit 2015 through the drive control I/F 1054 and the drive I/F 2014 at predetermined time intervals, and thereby acquires the latest fan revolving speed measurement values 1502 and the latest temperature measurement value 1503 recorded for each of the fan units 230 (S2201). Then, the revolving speed controlling unit 1302 determines the representative temperature in a method such as the above (S2202).

The revolving speed controlling unit 1302 acquires the current setup revolving speed retained in the memory 1043 (local memory) of the MP board 104, for example, and determines whether or not the setup value is SP1 (S2203). When judging that the setup revolving speed is SP1 (S2203: Yes), the revolving speed controlling unit 1302 determines whether or not the representative temperature is equal to or above the threshold T1H (S2204). When judging that the representative temperature is equal to or above T1H (S2204: Yes), the revolving speed controlling unit 1302 changes the setup revolving speed to SP2, and transmits instruction information indicating the speed change to the fan driver 232 of each of the fan units 230 through the environment monitor circuit 2015 (S2205). When judging that the representative temperature falls below T1H in S2204 (S2204: No), the revolving speed controlling unit 1302 keeps the current setup revolving speed SP1.

Then, when judging that setup revolving speed is not SP1 in S2203 (S2203: No), the revolving speed controlling unit 1302 determines whether or not the current revolving speed setup value is SP2 (S2206). When judging that the setup revolving speed is SP2 (S2206: Yes), the revolving speed controlling unit 1302 determines whether or not the representative temperature is equal to or above the threshold T2H (S2207). When judging that the representative temperature is equal to or above T2H (S2207: Yes), the revolving speed controlling unit 1302 changes the setup revolving speed to SP3, and transmits instruction information indicating the speed change to the fan driver 232 of each of the fan units 230 through the environment monitor circuit 2015 (S2208). When judging that the representative temperature is below T2H in S2207 (S2207: No), the revolving speed controlling unit 1302 determines whether the representative temperature is equal to or below the threshold T2L (S2209). When judging that the representative temperature is equal to or below T2L (S2209: Yes), the revolving speed controlling unit 1302 changes the setup revolving speed to SP1, and transmits instruction information indicating the speed change to the fan driver 232 of each of the fan units 230 through the environment monitor circuit 2015 (S2210). When judging that the representative temperature exceeds T2L in S2209 (S2209: No), the revolving speed controlling unit 1302 keeps the current setup revolving speed SP2.

Then, when judging that the setup revolving speed is not SP2 in S2206 (S2206: No), the revolving speed controlling unit 1302 determines whether or not the representative temperature is equal to or below the threshold T3L (S2211). When judging that the representative temperature is equal to or below T3L (S2211: Yes), the revolving speed controlling unit 1302 changes the setup revolving speed to SP2, and transmits instruction information indicating the speed change to the fan driver 232 of each of the fan units 230 through the environment monitor circuit 2015 (S2212). When judging that the representative temperature exceeds T3L in S2211 (S2211: No), the revolving speed controlling unit 1302 keeps the current setup revolving speed SP3.

Through the above processing, the revolving speed of each of the fans 231 is controlled by using the suitable setup value according to the representative temperature, which enables the fans 231 to properly cool the internal devices in the chassis 210 while reducing power consumption and noise. In addition, the thresholds for the representative temperature are each set with a hysteresis, whereby frequent revolving speed change and following increase in power consumption and noise can be prevented.

Control Scheme Based on Prediction of Intake Air Temperature Change

In the aforementioned intake air temperature based control scheme, the revolving speed of each of the fans 231 is set simply based on the representative temperature obtained from the temperature measurement values. The environment monitor database 1500 has a history generated by recording the temperature measurement values measured in the past, as illustrated in FIG. 14. Thus, a future temperature change may be predicted from the past actual change in the representative temperatures, and the fan revolving speed can be set based on the prediction result.

FIG. 23 shows an exemplary processing flow of revolving speed control processing based on a prediction result of intake air temperature change.

Firstly, the revolving speed controlling unit 1302 accesses the environment monitor database 1500 held by the environment monitor circuit 2015 through the drive control I/F 1054 and the drive I/F 2014 at predetermined time intervals, and thereby acquires the latest temperature measurement value 1503 recorded for each of the fan units 230 (S2301). Then, the revolving speed controlling unit 1302 determines the representative temperature in a method such as the above (S2302).

Then, the revolving speed controlling unit 1302 acquires the previous temperature measurement values from the environment monitor database 1500, determines the previous representative temperature in the same method (S2303), and calculates a difference between the previous representative temperature and the latest representative temperature (S2304). Specifically, when the latest representative temperature is higher than the previous representative temperature, the difference takes a positive value.

Next, the revolving speed controlling unit 1302 determines whether the difference value is equal to or above a certain positive threshold (S2305). When judging that the difference value is equal to or above the threshold (S2305: Yes), the revolving speed controlling unit 1302 increases the setup revolving speed of the fans 231 by two levels, and transmits instruction information indicating the speed increase to the fan driver 232 of each of the fan units 230 through the environment monitor circuit 2015 (S2306). This way of controlling is determined based on a prediction that the representative temperature will rise continuously after the current measurement time because the value of the representative temperature rise from the previous measurement time to the current measurement time is equal to or above the certain threshold. When the setup revolving speed of the fans 231 is SP1, the setup revolving speed is changed to SP3 under this control.

When judging that the difference between the representative temperatures is below the threshold in S2305 (S2305: No), the revolving speed controlling unit 1302 determines whether or not the difference value is positive (S2307). When judging that the difference value is positive (S2307: Yes), the revolving speed controlling unit 1302 increases the setup revolving speed of the fans 231 by one level, and transmits instruction information indicating the speed increase to the fan driver 232 of each of the fan units 230 through the environment monitor circuit 2015 (S2308). This way of controlling is determined based on a prediction that the representative temperature will rise to some extent continuously after the current measurement time, although the value of the representative temperature rise from the previous measurement time to the current measurement time is below the certain threshold.

When judging that the difference value is not positive in S2307 (S2307: No), the revolving speed controlling unit 1302 determines whether or not the difference value is negative (S2309). When judging that the difference value is negative (S2309: Yes), the revolving speed controlling unit 1302 decreases the setup revolving speed of the fan 231 by one level, and transmits instruction information indicating the speed decrease to the fan driver 232 of each of the fan units 230 through the environment monitor circuit 2015 (S2310). When judging that the difference value is not negative in S2309 (no temperature fall occurs between the latest two representative temperatures) (S2309: No), the revolving speed controlling unit 1302 keeps the current setup revolving speed.

Through the above processing, the inside of the chassis 210 of the storage apparatus 10 can be prevented in advance from reaching excessively high temperature due to a rise of the representative temperature, i.e., a rise of the intake air temperature indicating the temperature of an environment where the storage apparatus 10 is installed. This also prevents troubles, such as failures of a plurality of storage drives 202, which in turn may lead to system down. Here, FIG. 24 shows a schematic example of the control according to the processing flow illustrated in FIG. 23.

Exhaust Air Temperature Based Control Scheme

In the example of FIG. 22, the revolving speed control of the fans 231 is performed by using the intake air temperatures (the measurement values acquired by the temperature sensors 235 located on the front side of the chassis 210). Instead, from the environment monitor database 1500 through internal network 106, the MP 1042 in charge of the fan operation control can acquire the temperature measurement values of the temperature sensors 235 installed in the fan units 230 placed on the rear side of the chassis 210. Thus, the representative temperature can be obtained from the exhaust air temperatures of the air heated inside the chassis 210, and the revolving speed of the fans 231 can be controlled based on the obtained representative temperature so as to keep the temperature inside the chassis constant. In this case, as illustrated together in FIG. 22, the control may be carried out by obtaining the representative temperature from the exhaust air temperatures instead of the intake air temperatures.

Through this processing, the revolving speed of each fan 231 can be increased to enhance its cooling performance, when the inside of the chassis 210 is heated to a high temperature due to heavy load placed on the storage drives 202 or the like. Otherwise, when the exhaust air temperature does not become very high due to light load, the fan revolving speed can be decreased to reduce power consumption and noise.

Control Scheme Based on Prediction of Exhaust Air Temperature Change

As similar to the above exemplary processing, the intake air temperature change prediction control scheme in FIG. 23 may use the exhaust air temperatures instead of the intake air temperatures. In this case, the representative temperature and the history thereof may be obtained from the exhaust air temperatures, and the revolving speed of the fans 231 can be set based on a prediction result of a change in the temperature of the inside of the chassis 210. Through this processing, the revolving speed of the fans 231 can be increased to enhance the cooling performance in advance, when it is predicted that the temperature inside the chassis 210 will rise due to a heavy load placed on the storage drives 202. In addition, when it is determined that the load on the storage drives 202 and the like inside the chassis 210 becomes light because the difference value decreases even though the exhaust air temperature is still high, it can be predicted that the heat generation inside the chassis 210 will decrease, and the cooling performance can be decreased based on the prediction result. In this way, the power consumption and noise of the fans 231 can be properly controlled.

Intake-Exhaust Air Temperature Change Based Control Scheme

In the configuration of the storage apparatus 10 in the present embodiment, the MP 1042 in charge of the fan operation control can access the environment monitor database 1500 retained by the environment monitor circuit 2015 provided on each drive board 201, and thereby acquire the temperature measurement values of the temperature sensors 235 installed in the fan units 230 on both of the front side and the rear side of the chassis 210, as has been described above. By use of these values, a difference representing a temperature rise from the intake air temperature to the exhaust air temperature can be calculated, and the revolving speed of the fans 231 can be controlled based on the calculated difference. FIG. 25 shows an exemplary control processing flow based on intake-exhaust air temperature change, i.e., a value of internal temperature-rise.

Firstly, the revolving speed controlling unit 1302 accesses the environment monitor database 1500 held by the environment monitor circuit 2015 through the drive control I/F 1054 and the drive I/F 2014 at predetermined time intervals, and acquires the latest temperature measurement value 1503 recorded for each of the fan units 230 installed on the front side and the rear side of the chassis 210 (S2501). Then, the revolving speed controlling unit 1302 determines the representative temperatures in a method such as the above, and calculates a difference between the front side and the rear side (S2502).

Next, the revolving speed controlling unit 1302 determines whether or not the difference value is equal to or above a certain positive threshold (S2503). When judging that the difference value is equal to or above the threshold (S2503: Yes), the revolving speed controlling unit 1302 increases the setup revolving speed of the fans 231 by two levels, and transmits instruction information indicating the speed increase to the fan driver 232 of each of the fan units 230 through the environment monitor circuit 2015 (S2504). This way of controlling is determined based on a judgment that a heat generation amount is increasing inside the chassis 210 because the value of internal temperature-rise, that is, the difference between the intake air temperature and the exhaust air temperature is equal to or above the certain threshold.

When judging that the difference between the representative temperatures is below the threshold in S2503 (S2503: No), the revolving speed controlling unit 1302 determines whether or not the difference value is positive (S2505). When judging that the difference value is positive (S2505: Yes), the revolving speed controlling unit 1302 keeps the currently-set setup revolving speed of the fans 231.

When judging that the difference value is not positive in S2505 (S2505: No), the revolving speed controlling unit 1302 decreases the setup revolving speed of the fans 231 by one level, and transmits instruction information indicating the speed decrease to the fan driver 232 of each of the fan units 230 through the environment monitor circuit 2015 (S2506).

Through the above processing, the revolving speed of the fans 231 can be controlled so as to confine the value of internal temperature-rise in the chassis 210 to a predetermined range. Here, FIG. 26 shows a schematic example of the control according to the processing flow illustrated in FIG. 25.

Control Scheme Based on Prediction of Change in Intake Air Temperature-Exhaust Air Temperature Difference In the aforementioned control based on the value of internal temperature-rise in the chassis 210 obtained as the difference between the intake air temperature and the exhaust air temperature, the history generated in the environment monitor database 1500 by recording the measurement values of the temperature sensor 235 of each of the fan units 230 may be additionally acquired. Then, a change in the value of internal temperature-rise in the chassis 210 may be predicted and thereby the revolving speed of the fans 231 can be set based on the prediction result. A specific control flow is almost the same as that in FIG. 23, but includes processing of calculating the difference between the previous value of internal temperature-rise and the current value of internal temperature-rise, and processing of similarly making a judgment by comparing the difference with a threshold set appropriately.

Through this processing, the revolving speed of the fans 231 can be set properly based on the prediction result of a change in the value of internal temperature-rise in the chassis 210. Thus, the power consumption and noise of the fans 231 can be reduced. In addition, when a sharp internal temperature-rise is predicted, the revolving speed of the fan 231 can be increased in advance, and thereby a system failure due to heat can be prevented effectively. FIG. 27 shows a schematic control example according to this control scheme. As shown in FIG. 27, when a sharp internal temperature-rise is predicted and it is determined that the difference exceeds the threshold, the revolving speed controlling unit 1302 largely increases the revolving speed of the fans 231. When the difference does not exceed the threshold but is predicted to increase, the revolving speed controlling unit 1302 increases the revolving speed of the fans 231 to a small extent. Instead, the revolving speed controlling unit 1302 keeps the current setup revolving speed when judging that the difference is not changed (the internal temperature-rise is not predicted), and decreases the setup revolving speed when predicting that the internal temperature will decrease.

Control at Fan Failure

Next, description will be provided for control in the case where any of the fans 231 stops operating or operates at lower revolving speed due to the occurrence of a failure. When such a failure occurs in a fan 231, the cooling performance for the chassis 210 where the fan 231 is installed is deteriorated until replacement for maintenance is completed. For example, in the configuration of the storage apparatus 10 in the present embodiment, when the fans 231 on the front side of the chassis 210 stop operating, the heat generated in the chassis 210 cannot be sufficiently discharged only by the fans 231 on the rear side which are operating under normal control. For this reason, when a failure of any fan 231 is detected, the revolving speed controlling unit 1302 performs the following control according to a processing flow illustrated in FIG. 28.

The revolving speed controlling unit 1302 determines whether or not a failure is detected by the anomaly detecting unit 1301 (S2801). When judging that the failure is detected (S2801: Yes), the revolving speed controlling unit 1302 sets the maximum rated speed for the revolving speed of the fans 231 mounted on the front side and the rear side of the chassis 210 where the fan 231 having the failure is mounted. Then, the revolving speed controlling unit 1302 transmits instruction information indicating the setting to the fan driver 232 of each of the fan units 230 through the environment monitor circuit 2015 (S2802). Through this processing, the cooling performance necessary for operation of the storage apparatus 10 can be ensured even when a failure occurs in part of the fans 231.

Control Scheme Using Configuration Information

In the configuration in the present embodiment, correspondence among each storage drive 202 providing a physical storage area, a RAID group generated from the physical storage area, an LDEV as a logical storage area, and LUNs into which the LDEV is divided is retained as configuration information in the maintenance device 300, for example, and can be acquired as needed by the MP 1042 performing the fan operation control. Accordingly, the revolving speed controlling unit 1302 implemented by the MP 1402 can control the revolving speed of the fans 231 according to the acquired configuration information.

For example, on the assumption that there is a LUN not being used at all by the server system 2, the storage drive 202 corresponding to the logical storage area of the unused LUN can be identified by using the configuration information. Knowing that the identified storage drive 202 does not perform any data I/O operation, the revolving speed controlling unit 1302 can make such a setting that the revolving speed of the fans 231 installed in the chassis 210 including the storage drive 202 can be lower than the setup value set under normal control. In this way, for the fans 231 installed in the chassis 210 in which heat generation is estimated to be low, the setup revolving speed can be decreased thereby to reduce power consumption and noise and to prevent the physical wearing out of mechanism elements of the fans 231.

Note that, each of the above illustrated fan revolving speed control schemes can produce a sufficient effect independently when being implemented alone, but a combination of two or more of the control schemes can exert a much higher effect. For example, a possible compound control scheme is one in which when all the fans 231 operate normally, the revolving speed is controlled based on the predicted value of internal temperature-rise in the chassis 210, and, in which when the occurrence of a failure in any of the fans 231 is detected, all the other fans 231 are forcedly operated at the maximum rated speed, for example. In this control scheme, after the fan 231 having the failure is replaced in maintenance, the revolving speed of all the fans 231 may be controlled again based on the predicted value of internal temperature-rise in the chassis 210.

As has been described above, the fan revolving speed control scheme in the present embodiment is capable of reducing power consumption and noise, and additionally improving operation stability of the storage apparatus 10 as well as preventing a system failure due to heat.

Management of MP in Charge of Fan Operation Control

The aforementioned operation control of the fans 231 is executed by any of the MPs 1042 mounted on the MP boards 104 serving as the revolving speed controlling unit 1302. The MP 1042 executes the operation control of the fans 231 by performing polling with the environment monitor circuit 2015 when needed. However, a main task of each of the MPs 1042 is to execute data I/O processing between the server system 2 and the storage drive 202. Therefore, it is desired to minimize influences to the overall data I/O processing performance due to the execution of the fan operation control by one of the MPs 1042.

In the storage apparatus 10 in the present embodiment, each of the MP 1042 can access any of the fan units 230 through the drive control I/F 1054, the drive I/F 2014 and the environment monitor circuit 2015, as has been described for FIG. 18. Thereby, the most suitable MP 1042 can be selected to enhance the operation efficiency of the storage apparatus 10 as a whole, and can be operated to execute the operation control of the fans 231. The MP 1042 thus selected is called "a fan control representative MP" here. The following processing executed by the MP 1042 is implemented in such a way that the MP 1042 executes a program implementing the fan controlling MP management unit 1400 in FIG. 13.

For the fan operation control by the fan control representative MP, one of the plurality of MP 1042 is selected as the fan control representative MP. Thus, the processing loads which might be otherwise placed on the other MPs 1042 for the fan operation control can be avoided thereby to prevent deterioration of the data I/O processing performance. In addition, the fan control representative MP does not have to share information for the fan operation control with the other MPs 1042, and therefore does not require the other MPs 1042 to access the local shared memory (the memory 1043) and the shared memory (the memory 1033 of the memory board 103). Hereinafter, this selection processing of the fan control representative MP will be described by taking a specific example.

Fan Control Representative MP Selection Processing for Each MP Board

FIG. 29 shows an exemplary processing flow in the case of selecting the fan control representative MP for each MP board 104. Taking the fan operation control system in FIG. 18 as an example, this is a configuration in which a single fan control representative MP 1042 is selected for each MP board 104, and two MPs 1042 belonging to the respective clusters control the revolving speed of all the fans 231 independently of each other. Since each of the fan control representative MPs 1042 performs the control independently as described above, the fan control representative MPs 1042 do not have to be synchronized with each other through the shared memory, and thereby can execute fast fan operation control.

During an initialization sequence in which each of the MPs 1042 mounted on the MP boards 104 in the controller device 100 are activated upon powering-on of the storage apparatus 10, the MP 1042 determines whether the memory bus to the memory 1043 in the MP board 104 which the MP 1042 itself belongs to is busy or not. The MP 1042 waits when the memory bus is busy (exclusive control of memory access) (S2901: Yes). When judging that the memory bus is not busy (S2901: No), the MP 1042 refers to a fan control representative right table stored in advance in the local shared memory of the memory 1043 (S2902). The fan control representative right table can be in a form including the identification codes (the MP numbers 1602 in the extended LDEV mapping table 1600) of all the MPs 1042, and having a selection flag recorded corresponding to the identification code of the MP 1042 selected as the fan control representative MP, for example. During the initialization sequence, the selection flag is not recorded for any of the MPs 1042. The MPs 1042 on the same MP board 104 sequentially refer to the fan control representative right table.

The MP 1042 determines whether or not the fan control representative MP is already selected in the referred to fan control representative right table (S2903), and proceeds to S2905 when judging that the fan control representative MP is already selected (S2903: Yes). When judging that the fan control representative MP is not selected yet (S2903: No), the MP 1042 records the selection flag corresponding to its own identification code in the fan control representative right table, and thus updates the table (S2904).

Meanwhile, in S2905, the MP 1042 determines whether or not the MP 1042 itself is the fan control representative MP recorded in the fan control representative right table (S2905). When judging that the MP 1042 is the fan control representative MP (S2905: Yes), the MP 1042 determines whether or not a polling processing timing set for the fan operation control has arrived (S2906). When judging that the polling processing timing has arrived (S2906, Yes), the MP 1042 accesses the environment monitor circuit 2015 and executes the fan operation control (S2907). After the execution of the fan operation control, the MP 1042 operates as the ordinary MP 1042 executing the data I/O processing or the like (S2908).

When the MP 1042 itself is not the fan control representative MP (S2905: No) or when it is determined that the fan operation control execution timing has not arrived yet (S2906: No), the MP 1042 operates as the ordinary MP (S2908).

Similarly, in the case where the MP board 104 in the controller device 100 is replaced for maintenance or the like, all the MPs 1042 refer to the local shared memory of the memory 1043 upon activation of the MPs 1042, and the first MP 1042 referring to the memory obtains a fan control representative right. After the determination of the fan control representative MP 1042, the other MPs 1042 do not access the local shared memory anymore and thereby the data I/O processing may not be adversely affected. In addition, even when the fan control representative MP of one of the MP boards 104 turns into a failure state and thus is disabled to execute the fan operation control, the other fan control representative MP of the other MP board 104 continuously operates. Thus, the fan control operation can be executed continuously, and thereby prevents influence on the cooling performance for the storage apparatus 10. Note that, when the fan operation control is performed by only a single fan control representative MP, the polling timing may be adjusted so as to prevent such single control operation from influencing the cooling performance for the storage apparatus 10.

Fan Control Representative MP Selection Processing Based on Configuration Information The storage apparatus 10 is out of use in the units of drive unit devices 200 sometimes depending on how the server systems 2 use the LDEVs (logical storage devices). To deal with this case, the fan control representative MP is selected from the plurality of MPs 1042 allocated to each of the LDEVs, and thus performs the fan operation control of the drive unit device 200 corresponding to the LDEV. In this way, the revolutions of the fans 231 mounted in the drive unit device 200 out of use can be stopped, or the drive unit device 200 can be powered off.

FIG. 30 shows an exemplary processing flow of fan control representative MP selection based on LDEV configuration information. The MP 1042 having the ownership of each LDEV is recorded in the extended LDEV mapping table 1600 (hereinafter simply called "the LDEV mapping table 1600") stored in the shared memory in the memory 1033 of the memory board 103. As illustrated in FIG. 16, the ownership 1603 indicating a MP in charge of each of the LDEVs identified by the respective LDEV numbers 1601 is recorded corresponding to the MP number 1602 of the MP 1042 in charge of data I/O processing on the LDEV. For the LDEV with the LDEV number 0, the two MPs with the MP numbers 00, 001 have the ownership 1603.

In this way, there are cases where two or more MPs 1042 have the ownership for one LDEV and where one MP 1042 has the ownership for two or more LDEVs. For this reason, the control should be performed such that one MP 1042 may not be selected as the fan control representative MP for a plurality of groups.

Firstly, when executing command processing for data I/O control or the like, the MP 1042 refers to the LDEV mapping table 1600 and processes the access command to a LDEV whose ownership 1603 is held by the MP 1042 itself (S3001). Then, the MP 1042 determines whether or not the MP 1042 itself is the fan control representative MP of an LDEV other than the LDEV for which the MP 1042 itself executes the command processing (S3002). When judging that the MP 1042 itself is the fan control representative MP of the other LDEV (S3002: Yes), the MP 1042 advances the processing to S3010.

When judging that the MP 1042 itself is not the fan control representative MP of the other LDEV (S3002: No), the MP 1042 determines whether the memory bus to the shared memory in the memory 1033 on the memory board 103 is busy or not, and waits if the memory bus is busy (S3003: Yes) (the exclusive control of the memory access). When judging the memory bus is not busy (S3003: No), the MP 1042 refers to the LDEV mapping table 1600 stored in the shared memory (S3004).

The MP 1042 determines whether the fan control representative MP is already selected in the referred to LDEV mapping table 1600 (S3005), and further determines whether the MP is already selected for the sub-representative right (S3007) when judging that the fan control representative MP is already selected (S3005: Yes). When judging that the fan control representative MP is not selected in S3005 (S3005: No), the MP 1042 records the selection flag corresponding to the MP 1042 itself in the LDEV mapping table 1600, and thus updates the table (S3006).

When judging that the MP is already selected for the sub-representative right in S3007 (S3007: Yes), the MP 1042 advances the processing to S3010. When judging that the fan control sub-representative MP is not selected yet (S3007: No), the MP 1042 determines whether the MP 1042 itself is mounted on the same MP board 104 as the fan control representative MP (S3008), and advances the processing to S3010 when judging that the MP 1042 itself is mounted on the same MP board 104 (S3008: Yes).

When judging that that the MP 1042 itself is not mounted on the same MP board 104 (S3008: No), the MP 1042 records the selection flag of the fan control sub-representative MP corresponding to the MP 1042 itself in the LDEV mapping table 1600, and thus updates the table (S3009).

In S3010, the MP 1042 determines whether or not the MP 1042 itself is any of the fan control representative MP and the fan control sub-representative MP recorded in the LDEV mapping table 1600 (S3010). The MP 1042 determines whether the polling processing timing set for the fan operation control has arrived (S3011) when judging that the MP 1042 itself is any of them (S3010: Yes), and executes the fan operation control by accessing the environment monitor circuit 2015 (S3012) when judging that the polling processing timing has arrived (S3011: Yes). The MP 1042 operates as the ordinary MP 1042 executing the data I/O processing and the like after the execution of the fan operation control.

When the MP 1042 itself is not any of the fan control representative MP and the fan control sub-representative MP (S3010: No), or when judging that the fan operation control execution timing has not arrived yet (S3011: No), the MP 1042 operates as the ordinary MP (S3013).

In the above processing, the MPs 1042 each exclusively access the LDEV mapping table 1600, the first MP 1042 referring to the LDEV mapping table 1600 and not serving as the fan control representative MP for the other LDEVs becomes the fan control representative MP, and the second MP 1042 referring to the LDEV mapping table 1600 in the shared memory becomes the fan control sub-representative MP. The fan control sub-representative MP is selected for the purpose of continuously executing the fan operation control even when a failure occurs in the MP 1042 serving as the fan control representative MP. In this respect, the fan control representative MP and the fan control sub-representative MP should not be selected from the same MP board 104 that is a unit to be replaced for maintenance in a processing flow in FIG. 31.

FIG. 31 shows an exemplary processing flow for a case where a failure occurs in the fan control representative MP. When a failure occurs in any of the MPs 1042 and is detected, the maintenance device 300 transmits MP failure information to all the MPs 1042 included in the same controller device 100 as the MP 1042 having the failure. When judging that the failure information is received (S3101: Yes), each of the MPs 1042 determines whether the MP 1042 itself is the fan control representative MP by referring to the LDEV mapping table 1600 (S3102). When judging that the MP 1042 itself is the fan control representative MP (S3102: Yes), the MP 1042 advances the processing to S3010 in the fan control representative MP selection processing (S3120).

When judging that the MP 1042 itself is not the fan control representative MP (S3102: No), the MP 1042 determines whether the MP 1042 itself is the fan control sub-representative MP (S3103). When judging that the MP 1042 itself is not the fan control sub-representative MP (S3103: No), the MP 1042 advances the processing to S3105 and executes the same steps (S3105 to S3113) as S3001 and the following steps in the fan control representative MP selection processing 3000 shown in FIG. 30.

When judging that the MP 1042 itself is the fan control sub-representative MP (S3103: Yes), the MP 1042 selects itself as the fan control representative MP in the LDEV mapping table 1600 and thus updates the table (S3104). Then, the MP 1042 advances the processing to S3010 in the fan control representative MP selection processing 3000. In this way, the fan control sub-representative MP is promoted to the fan control representative MP, and then the fan control sub-representative MP is selected again. When a failure occurs in the fan control sub-representative MP, the fan control sub-representative MP is selected again as in the case where the fan control sub-representative MP is promoted to the fan control representative MP.

Through the foregoing processing, the fan operation in a drive unit device 200 not needing cooling can be stopped according to the utilization states of the respective LDEVs, and thereby power consumption can be reduced. Moreover, in this case, the fan operation control processing for the drive unit device 200 does not have to be executed by the MPs 1042, therefore the data I/O processing that is originally a main task of the MPs 1042 is not influenced anymore.

Fan Control Representative MP Selection Processing in System

The fan control representative MP can be selected from the MPs 1042 mounted in a whole system, instead of the aforementioned selection for each MP board or each LDEV. In this case, also, the fan control representative MP and the fan control sub-representative MP are selected such that the fan operation control will not be stopped at the time of an MP failure.

When the MPs are activated (during the initialization sequence), all the MPs 1042 mounted in the system refer to the LDEV mapping table 1600 in the shared memory of the memory board 103, and determine whether or not the MP 1042 itself is any of the fan control representative MP and the fan control sub-representative MP. When the fan control representative MP and the fan control sub-representative MP need to be reselected at the time when an MP failure occurs, the maintenance device 300 makes a reselection notification to all the MPs 1042 in the system. A specific processing flow of this selection processing is similar to the fan control representative MP selection processing flows shown in FIG. 30 and FIG. 31.

The fan control representative MP and the fan control sub-representative MP perform the operation control of the fans 231 installed in all the drive unit devices 200 included in the system. The fan control representative MP and the fan control sub-representative MP operate independently of each other, and thus do not have to be synchronized with the other MPs 1042 nor access the shared memory. This does not produce any influence on the performance of the data I/O processing executed by the ordinary MPs 1042 other than the fan control representative MP. In addition, the load on the fan control representative MP can be reduced.

The aforementioned operation control of the fans 231 by the fan control representative MP can be configured such that an MP 1042 may determine the fan revolving speed while another MP 1042 may read the measurement values of the temperature sensors 235. In the case where the fan control representative MP is selected for each MP board 104, for example, the other three MPs 1042 located on the same board 104 as the fan control representative MP may be operated to acquire the temperature measurement values after the selection of the fan control representative MP. The temperature measurement values thus acquired can be recorded in a temperature measurement value management table, for example, which is prepared in advance in the local shared memory of the memory 1033 on the memory board 103.

The fan control representative MP can refer to the temperature measurement values recorded in the temperature measurement value management table in polling cycles for the fan operation control processing, and thereby determine the revolving speed from the data of the temperature measurement values. Through this processing, the load concentration on the fan control representative MP can be prevented, and the cycle in which each MP 1042 acquires the temperature measurement values can be made longer by independently operating the other three MPs 1042 other than the fan control representative MP. As a result, the processing load on each of the MPs 1042 can be reduced and the performance deterioration of the data I/O processing can be minimized.

Scheme of Controlling All Fans by All MPs in System

In another possible fan operation control configuration, the acquisition of the temperature measurement values and the control of the fan revolving speed can be executed by all the MPs 1042 included in a system independently of each other.

Here, the system can be defined as any of various ranges such as a chassis of the storage apparatus 10, a group of MP boards belonging to a single power supply system, a controller device 100, a group of MPs in charge of data I/O processing for a particular server system 2, for example. In such a configuration, all the MPs 1042 in the system operate independently for the fan operation control processing, and therefore the execution cycle of acquiring temperature measurement values and controlling the fan revolving speed can be made much longer. Thus, the load on each of the MPs 1042 is further reduced. Moreover, since each of the MPs 1042 does not have to be synchronized with the other MPs 1042, the MPs 1042 do not have to access the shared memory, which in turn can minimize the influence on the data I/O processing performance. In addition, all the MPs 1042 perform the fan operation control, and therefore the cooling performance in the whole storage apparatus 10 is maintained even in the case where any one of the MPs 1042 has a failure, or any one of the MP boards 104 is removed for replacement in maintenance or the like.

Hereinabove, the present invention has been explained on the basis of the embodiments. The storage apparatus and the method of controlling cooling fans for a storage apparatus according to the embodiments are capable of producing the following technological effects.

The MP executing the fan operation control uses a path between the MP and the storage drive for ordinary data I/O processing to acquire information on temperature, revolving speed and the like necessary for the fan operation control and to transmit instruction control information for the fan operation control. Accordingly, there is no need to newly provide a network line for the fan operation control and all the MPs are enabled to execute the operation control for all the fans installed in the drive unit device.

Since one MP for the fan operation control execution is selected from a plurality of MPs and is operated to execute the fan operation control, the performance of the data I/O processing which is originally a main task of the MPs can be prevented from being influenced.

The fan revolving speed can be appropriately set according to the actual measurement values of the intake air temperature and the exhaust air temperature of the drive unit device, the value of internal temperature-rise, or a change prediction result based on the history of these values in the past. Therefore, the internal devices in the chassis can be properly cooled while the power consumption and noise due to the fan operation can be reduced.

In the case where a failure occurs in any of the fans, the revolving speed of the other fans operating in good condition is increased. Thereby, the good cooling performance can be maintained continuously even until the fan having the failure is replaced.

The fan operation in a chassis or the like not needing cooling by means of the fans can be stopped on the basis of the configuration information of the storage apparatus. Accordingly, the power consumption and noise can be further reduced.

Since the MP monitors the ambient temperature of the storage apparatus, it is possible to collect data for predicting in advance an aging failure of an electric component such as a storage drive. Moreover, the monitoring of the value of internal temperature-rise in the storage apparatus enables a prevention of a failure that may lead to system down.

The MP monitors the revolving speeds of the fans, and thereby can more finely recognize the operating states of the fans. Accordingly, when any of the fans mechanically wears out, the revolving speed of the other fans is increased to maintain the necessary cooling performance. In addition, a fan can be preventively replaced before the fan has a failure.

Since the fan unit is provided with the open-close linked switch, the power supply to the fans can be easily stopped when maintenance work is performed on the storage apparatus.

Although the present embodiment has been described above, the foregoing embodiments are intended to make the present invention easy to understand, and not intended to limit the interpretation of the present invention. The present invention can be modified and improved without departing from the spirit thereof, and also includes any equivalent to the present invention.

The invention claimed is:

1. A storage apparatus comprising:
a storage drive to provide a physical storage area for creating a logical storage area to be used by an external apparatus;
a storage controller including a plurality of central processing units to execute data write processing from the external apparatus to the storage drive, and data read processing from the storage drive;
a plurality of cooling fans to cool the storage drive;
a temperature sensor to detect a temperature of air introduced or discharged by the cooling fans; and
a revolving speed sensor to detect a revolving speed of each of the cooling fans, wherein
any one of the plurality of central processing units executes operation control processing in which measurement values of the temperature sensor and the revolving speed sensor are acquired through a data network path to the storage drive for the data write processing and the data read processing, and in which a revolving speed setup value of each of the cooling fans calculated based on the measurement values of the temperature sensor and the revolving speed sensor is transmitted to the cooling fans through the data network path,
any one of the plurality of central processing units acquires the temperature sensor measurement values detected by the temperature sensor for the air introduced by the cooling fans and the air discharged by the cooling fans, and determines the revolving speed setup value to be instructed to each of the cooling fans, according to a result of comparison in which a difference between the temperature sensor measurement values of the air introduced by the cooling fans and the air discharged by the cooling fans is compared with a predetermined temperature threshold,
the storage controller includes a plurality of central processing unit boards on each of which a predetermined unit number of central processing units out of the plurality of central processing units are mounted, and one central processing unit selected from the central processing units mounted on each of the central processing unit boards operates as a representative central processing unit to execute the operation control processing of the cooling fans,
a sub-representative central processing unit being a reserve central processing unit to execute the operation control processing of the cooling fans is selected from the central processing units mounted on the central processing unit board different from the central processing unit board including the representative central processing unit, and the sub-representative central processing unit executes the operation control processing of the cooling fans in a case where the representative central processing unit is disabled from executing the operation control processing, when detecting that a failure occurs in any of the cooling fans, the central processing unit executing the operation control processing of the cooling fans changes the revolving speed setup value of each of the other cooling fans having no failure to a revolving speed value higher than the value set in advance, and the plurality of the cooling fans are assembled to form cooling fan units, the cooling fan units are installed on a chassis of the storage apparatus in an openable and closable manner, and each of the cooling fan units is provided with an open-close linked switch to detect the opening and closing of the cooling fan unit and to stop power supply to the cooling fans when the cooling fan unit is opened.

2. The storage apparatus according to claim 1, wherein any one of the plurality of central processing units acquires the temperature sensor measurement value detected by the temperature sensor for air introduced by the cooling fans, and determines the revolving speed setup value to be instructed to each of the cooling fans, according to a result of comparison in which the temperature sensor measurement value is compared with a predetermined temperature threshold.

3. The storage apparatus according to claim 1, wherein any one of the plurality of central processing units acquires the temperature sensor measurement value detected by the temperature sensor for air discharged by the cooling fans, and determines the revolving speed setup value to be instructed to each of the cooling fans, according to a result of comparison in which the temperature sensor measurement value is compared with a predetermined temperature threshold.

4. The storage apparatus according to claim 1, wherein any one of the plurality of central processing units acquires the temperature sensor measurement values detected by the temperature sensor for the air introduced by the cooling fans and the air discharged by the cooling fans, and determines the revolving speed setup value to be instructed to each of the cooling fans, according to a result of comparison in which a difference between the temperature sensor measurement values of the air introduced by the cooling fans and the air discharged by the cooling fans is compared with a predetermined temperature threshold.

5. The storage apparatus according to claim 1, wherein the storage controller includes a temperature history storage to cyclically acquire and store the temperature sensor measurement value detected by the temperature sensor for at least one of air introduced by the cooling fans and air discharged by the cooling fans, and any one of the plurality of central processing units obtains, from the temperature history storage, an amount of change with time in any one of the temperature sensor measurement value of the air introduced by the cooling fans, the temperature sensor measurement value of the air discharged by the cooling fans, and a difference between the temperature sensor measurement values of the air introduced and the air discharged by the cooling fans, and determines the revolving speed setup value to be instructed to each of the cooling fans, according to a result of comparison in which the amount of change with time is compared with a predetermined temperature threshold.

6. The storage apparatus according to claim 1, wherein the storage controller includes a plurality of central processing unit boards on each of which a predetermined unit number of central processing units out of the plurality of central processing units are mounted, and one central processing unit selected from the central processing units mounted on each of the central processing unit boards operates as a representative central processing unit to execute the operation control processing of the cooling fans.

7. The storage apparatus according to claim 6, wherein a sub-representative central processing unit being a reserve central processing unit to execute the operation control processing of the cooling fans is selected from the central processing units mounted on the central processing unit board different from the central processing unit board including the representative central processing unit, and the sub-representative central processing unit executes the operation control processing of the cooling fans in a case where the representative central processing unit is disabled from executing the operation control processing.

8. The storage apparatus according to claim 1, wherein at least part of the plurality of central processing units is assigned data processing on unit logical storage areas included in the logical storage area to be used by the external apparatus, one central processing unit selected from the central processing units assigned the unit logical storage areas operates as a representative central processing unit to execute the operation control processing of the cooling fans.

9. The storage apparatus according to claim 1, wherein one central processing unit selected from the central processing units operates as a representative central processing unit to execute the operation control processing of the cooling fans, and the representative central processing unit is selected from the central processing units included in any one of the storage controller, a chassis of the storage apparatus, and a power supply system of the chassis of the storage apparatus.

10. The storage apparatus according to claim 1, wherein when detecting that a failure occurs in any of the cooling fans, the central processing unit executing the operation control processing of the cooling fans changes the revolving speed setup value of each of the other cooling fans having no failure to a revolving speed value higher than the value set in advance.

11. The storage apparatus according to claim 1, wherein a plurality of the cooling fans are assembled to form a cooling fan unit, a plurality of the cooling fan units are installed on a chassis of the storage apparatus in an openable and closable manner, and each of the cooling fan units is provided with an open-close linked switch to detect the opening and closing of the cooling fan unit and to stop power supply to the cooling fans when the cooling fan unit is opened.

12. A method of controlling cooling fans for a storage apparatus including:

a storage drive to provide a physical storage area for creating a logical storage area to be used by an external apparatus;

a storage controller including a plurality of central processing units to execute data write processing from the external apparatus to the storage drive, and data read processing from the storage drive;

a plurality of cooling fans to cool the storage drive;
a temperature sensor to detect a temperature of air introduced or discharged by the cooling fans; and
a revolving speed sensor to detect a revolving speed of each of the cooling fans, the method comprising
executing operation control processing by any one of the plurality of central processing units, the operation control processing including acquiring measurement values of the temperature sensor and the revolving speed sensor through a data network path to the storage drive for the data write processing and the data read processing; and
transmitting, to the cooling fans through the data network path, a revolving speed setup value of each of the cooling fans calculated based on the measurement values of the temperature sensor and the revolving speed sensor,
wherein,
any one of the plurality of central processing units acquires the temperature sensor measurement values detected by the temperature sensor for the air introduced by the cooling fans and the air discharged by the cooling fans, and determines the revolving speed setup value to be instructed to each of the cooling fans, according to a result of comparison in which a difference between the temperature sensor measurement values of the air introduced by the cooling fans and the air discharged by the cooling fans is compared with a predetermined temperature threshold,
the storage controller includes a plurality of central processing unit boards on each of which a predetermined unit number of central processing units out of the plurality of central processing units are mounted, and one central processing unit selected from the central processing units mounted on each of the central processing unit boards operates as a representative central processing unit to execute the operation control processing of the cooling fans,
a sub-representative central processing unit being a reserve central processing unit to execute the operation control processing of the cooling fans is selected from the central processing units mounted on the central processing unit board different from the central processing unit board including the representative central processing unit, and the sub-representative central processing unit executes the operation control processing of the cooling fans in a case where the representative central processing unit is disabled from executing the operation control processing,
when detecting that a failure occurs in any of the cooling fans, the central processing unit executing the operation control processing of the cooling fans changes the revolving speed setup value of each of the other cooling fans having no failure to a revolving speed value higher than the value set in advance, and
the plurality of the cooling fans are assembled to form cooling fan units, the cooling fan units are installed on a chassis of the storage apparatus in an openable and closable manner, and each of the cooling fan units is provided with an open-close linked switch to detect the opening and closing of the cooling fan unit and to stop power supply to the cooling fans when the cooling fan unit is opened.

* * * * *